United States Patent [19]

Lowrey et al.

[11] Patent Number: 5,328,810
[45] Date of Patent: Jul. 12, 1994

[54] METHOD FOR REDUCING, BY A FACTOR OR $2^{-N}$, THE MINIMUM MASKING PITCH OF A PHOTOLITHOGRAPHIC PROCESS

[75] Inventors: Tyler A. Lowrey; Randal W. Chance; David A. Cathey, all of Boise, Id.

[73] Assignee: Micron Technology, Inc., Boise, Id.

[21] Appl. No.: 981,976

[22] Filed: Nov. 25, 1992

Related U.S. Application Data

[63] Continuation-in-part of Ser. No. 519,992, May 7, 1990, abandoned.

[51] Int. Cl.$^5$ ............................................. G03C 5/00
[52] U.S. Cl. ................................. 430/313; 430/311; 430/314; 430/317; 430/322; 430/323; 430/329; 430/331
[58] Field of Search ............... 430/313, 311, 314, 317, 430/322, 323, 329, 331

[56] References Cited

U.S. PATENT DOCUMENTS

| | | | |
|---|---|---|---|
| 4,256,514 | 3/1981 | Pogge | 148/1.5 |
| 4,419,809 | 12/1988 | Riseman et al. | 156/643 |
| 4,436,584 | 3/1984 | Bernacki et al. | 156/643 |
| 4,528,066 | 7/1985 | Merkling, Jr. et al. | 156/643 |
| 4,707,218 | 11/1987 | Giammarco et al. | 156/643 |
| 4,838,991 | 6/1989 | Cote et al. | 156/643 |

FOREIGN PATENT DOCUMENTS 1-214862  2/1988  Japan .

*Primary Examiner*—John Kight, III
*Assistant Examiner*—T. Mosley
*Attorney, Agent, or Firm*—Angus C. Fox, III

[57] ABSTRACT

The process starts with a primary mask, which may be characterized as a pattern of parallel, photoresist strips having substantially vertical edges, each having a minimum feature width F, and being separated from neighboring strips by a minimum space width which is also approximately equal to F. From this primary mask, a set of expendable mandrel strips is created either directly or indirectly. The set of mandrel strips may be characterized as a pattern of parallel strips, each having a feature width of F/2, and with neighboring strips being spaced from one another by a space width equal to 3/2F. A conformal stringer layer is then deposited. The stringer layer material is selected such that it may be etched with a high degree of selectivity with regard to both the mandrel strips and an underlying layer which will ultimately be patterned using a resultant, reduced-pitch mask. The stringer layer is then anisotropically etched to the point where the top of each mandrel strip is exposed. The mandrel strips are then removed with an appropriate etch. A pattern of stringer strips remains which can then be used as a half-pitch mask to pattern the underlying layer. This process may also be repeated, starting with the half-pitch mask and creating a quarter-pitch mask, etc. As can be seen, this technique permits a reduction in the minimum pitch of the primary mask by a factor of $2^{-N}$ (where N is an integer 1, 2, 3, ...).

32 Claims, 23 Drawing Sheets

METHOD FOR REDUCING, BY A FACTOR OR $2^{-N}$, THE MINIMUM MASKING PITCH OF A PHOTOLITHOGRAPHIC PROCESS

RELATED APPLICATIONS

This is a continuation-in-part of application Ser. No. 07/519,992 filed on May 7, 1990, now abandoned.

FIELD OF THE INVENTION

This invention relates to micro-miniature manufacturing methods, such as those used to fabricate integrated circuits. More particularly, it relates to photolithography masking processes and the deposition of vertical, thin film layers.

BACKGROUND OF THE INVENTION

Since the late 1960s, a new generation of integrated circuits has been developed approximately every four years. Each generation has been characterized by a halving of device dimensions, resulting in a four-fold density increase over the preceding generation. Increases in circuit density have been consistently limited by the resolution of the available photolithographic equipment. The minimum size of features and spaces that a given piece of photolithographic equipment can produce is directly related to its resolution capability. The sum of minimum feature width (F) and minimum space width (S) producible with a given piece of photolithographic equipment is referred to in this disclosure as "minimum pitch". Since, for practical purposes, F can be considered to be equal to S, minimum pitch is, therefore, approximately equal to double the minimum feature width, or 2F. Using contemporary photolithography techniques, one line (feature) and one space may be defined for a given minimum pitch.

It has long been recognized, by those skilled in the fabrication of integrated circuits, that vertical film layers as thin as 0.01 μm can be grown with a high degree of accuracy. By comparison, the minimum feature size, producible with the present generation of photolithography equipment used to produce 1-megabit SRAMs and 4-megabit DRAMs, is approximately 0.5 μm. Therefore, utilizing contemporary equipment in conjunction with contemporary photolithography techniques, approximately 1.0 μm (the minimum pitch) is required to define one line and one space.

Thin-film technology has been used to create integrated circuit structures having either reduced feature width or reduced space width. U.S. Pat. No. 4,419,809, issued to IBM Corp. employees Jacob Riseman and Paul Tsang, is exemplary of a process for reducing feature width. With this process, submicron MOSFET gates are formed by performing a plasma anisotropic (spacer) etch on a thin conformal layer deposited over a mandrel having substantially vertical sidewalls. An example of a process for reducing space width (S) is found in U.S. Pat. No. 4,256,514. Issued to Hans Pogge (also an employee of IBM Corporation), this patent describes a method for decreasing the width of a trenched region on a silicon substrate by depositing a thin conformal layer and then performing an anisotropic plasma etch which leaves spacers on the walls surrounding the trenched region.

If vertical thin film layers could be used to provide a repeating pattern of a feature and a space, which together total less than 2F (the minimum pitch of the utilized photolithographic process), minimum pitch could be effectively reduced, resulting in increased circuit density equal to the square of the reciprocal of the reduction factor.

SUMMARY OF THE INVENTION

The process of the present invention starts with a primary photoresist mask created using conventional photolithography, which may be characterized as a pattern of parallel, photoresist strips having substantially vertical edges, each having a minimum feature width F, and being separated from neighboring strips by a minimum space width which is also approximately equal to F. This primary mask is transformed, either directly or indirectly, into a set of mandrel strips. The set of mandrel strips may be characterized as a pattern of parallel strips, each having a feature width of F/2, and with neighboring strips being spaced from one another by a space width equal to 3/2F. A conformal stringer layer is then deposited. The material for the stringer layer is selected such that it may be etched with a high degree of selectivity with regard to both the mandrel strips and an underlying layer. The stringer layer is then anisotropically etched to form stringers on the sidewalls of each mandrel strip. The top of each mandrel, as well as regions of the underlying layer between the stringer-widened mandrel strips is exposed during the anisotropic etch. The mandrel strips are then removed with an appropriately selective etch. A pattern of stringer strips remains which can then be used as a half-pitch mask to pattern the underlying layer. This process may also be repeated, starting with the half-pitch mask and creating a quarter-pitch mask, etc. As can be seen, this technique permits a reduction in the minimum pitch of the primary mask by a factor of $2^{-N}$ (where N is an integer 1, 2, 3, . . . ). Alternatively, the stringers may serve as a final structure.

In a first embodiment of the process, an expendable layer is anisotropically etched with the primary photoresist mask pattern in place, thus creating full-width expendable material strips that replicate the primary mask. These expendable material strips are then isotropically etched, preferably with the primary mask still in place, in order to halve their width and create the desired mandrel strips.

Utilizing a variant of the first embodiment of the process, the expendable layer, being masked with the primary photoresist mask, is subjected to an anisotropic etch having an isotropic component, in order to create the desired mandrel strips.

In a second embodiment of the process, the photoresist strips of the primary mask (which are applied to an expendable layer) are subjected to an oxygen plasma etch in order to reduce their height and, more importantly, halve their width. With the plasma-etched photoresist strips in place, the expendable layer is anisotropically etched to create the expendable mandrel strips.

In a third embodiment of the process, the oxygen plasma-etched photoresist strips are used directly as the expendable mandrel strips, and the expendable layer is dispensed with entirely. A polymer stringer layer is then conformally deposited over the mandrel strips. Following an anisotropic etch of the polymer stringer layer, the photoresist is removed. The polymer stringer strips comprise the 1/2 pitch mask.

In a more complex, fourth embodiment of the process, the primary mask pattern is transferred to an underlying expendable layer with an anisotropic etch to create a first set of temporary strips that are F wide and separated by a space also equal to F. A conformal spacer layer having a thickness of ¼F is deposited over the first set of mandrel strips, and then anisotropically etched to form spacers on the sidewalls of each of the first mandrel strips. Thus a new, second set of temporary strips has been created which have a width of 3/2F and are separated by F/2 spacing. It should be noted that this configuration is a reverse image of the mandrel strips required to generate a pitch doubled array. In order to reverse the image and provide the required mandrel strips, a spin-on glass layer is applied which fills the gaps between the spacer strips. One of many available planarization techniques (including, but not limited to chemical-mechanical planarization and photoresist etch back) is used to create the desired mandrel strips between the second set of temporary strips. The second set of temporary strips is then etched away.

Any of the four embodiments may be employed to provide substantially equivalent results, although several embodiments possess definite advantages in terms of simplicity. It will, of course, be obvious to one of ordinary skill in the art of integrated circuit manufacture that the materials for the different layers must be chosen so as to enable selective etching of one portion of the structure with respect to another. Although certain materials will be specified in this disclosure, they are meant to provide only exemplary, enabling embodiments of the process. Substitute materials that will provide an equivalent process flow are either available or may likely be discovered.

This half-pitch masking technique may be used to create a variety of semiconductor structures. Although the technique was originally developed to define structures within ultra high density DRAM arrays, the technique may also be used to create structural features of SRAM arrays, logic arrays and other types of semiconductor arrays where an increase in device density is desired.

BRIEF DESCRIPTION OF THE DRAWINGS

FIGS. 1, 5 and 6 depict a second embodiment sequence for making the same pattern of mandrel strips;

FIGS. 1, 2, 7, 8, 9, 10, and 11 depict a third embodiment sequence for making the same pattern of mandrel strips; and FIGS. 1 and 12 depict a fourth embodiment sequence for making an equivalent pattern of mandrel strips out of photoresist.

FIG. 1 is a cross-sectional view of a portion of an in-process substrate, on which has been formed a superjacent expendable layer, which has in turn been masked with a primary mask consisting of a pattern of photoresist strips of substantially identical width, separated by gaps substantially equal to the width of the photoresist strips;

FIG. 2 is a cross-sectional view of the in-process structure of FIG. 1 following an anisotropic etch of the expendable layer;

FIG. 3 is a cross-sectional view of the in-process structure of FIG. 2 following an isotropic etch of the expendable layer with the primary mask in place;

FIG. 4 is a cross-sectional view of the in-process structure of FIG. 3 following a photoresist strip;

FIG. 5 is a cross-sectional view of the in-process structure of FIG. 1 following an oxygen plasma etch step, which reduces the height and width of the photoresist strips;

FIG. 6 is a cross-sectional view of the in-process structure of FIG. 5 following an anisotropic etch of the expendable layer;

FIG. 7 is a cross-sectional view of the in-process structure of FIG. 2 following the deposition of a conformal layer ¼F in thickness;

FIG. 8 is a cross-sectional view of the in-process structure of FIG. 7 following an anisotropic etch of the ¼F-thick conformal layer;

FIG. 9 is a cross-sectional view of the in-process structure of FIG. 8 following the deposition of a spin-on filler layer;

FIG. 10 is a cross-sectional view of the in-process structure of FIG. 9 following a chemical-mechanical planarization step;

FIG. 11 is a cross-sectional view of the in-process structure of FIG. 10 following the removal of remnants of both the expendable layer and the ¼F-thick conformal layer;

FIG. 12 is a cross-sectional view of a portion of an in-process substrate, which has been masked with a primary mask consisting of a pattern of photoresist strips of substantially identical width, separated by gaps substantially equal to the width of the photoresist strips;

FIG. 13 is a cross-sectional view of the structure of FIG. 12 following an oxygen plasma etch step, which reduces the height and width of the photoresist strips;

FIG. 14 is a cross-sectional view of the structure of FIG. 4 (or FIGS. 11 or 13) following the deposition of a conformal stringer layer having a thickness of F/2.

FIG. 15 is a cross-sectional view of the structure of FIG. 14 following an anisotropic etch of the conformal ¼F-thick spacer layer;

FIG. 16 is a cross-sectional view of the structure of FIG. 15 following the removal of the mandrel strips;

FIG. 17 is a cross-sectional view of the structure of FIG. 16 following the creation of a peripheral mask and a subsequent anisotropic etch of the substrate using the half-pitch pattern as a mask;

FIG. 18 is an isometric view of the structure depicted in FIG. 17;

FIG. 19 is a cross-sectional view of the structure of FIG. 16 following a halving of the feature width of the strips of the half-pitch pattern;

FIG. 20 is a cross-sectional view of the structure of FIG. 19 following the deposition of a secondary conformal stringer layer having a thickness of ¼F;

FIG. 21 is a cross-sectional view of the structure of FIG. 20 following an anisotropic etch of the secondary conformal stringer layer;

FIG. 22 is a cross-sectional view of the structure of FIG. 21 following the removal of remnants of the 1/2 pitch pattern.

DETAILED DESCRIPTION OF THE PREFERRED EMBODIMENT

Although the pitch reduction method will be described in the context of a process sequence for creating either a pattern of evenly-spaced strips on a substrate or a pattern of evenly-spaced trenches in a substrate, the masking method is very flexible, and may be used to pattern a multitude of features for micro-miniature structures, such as semiconductor circuitry.

Although the process is described as beginning with a primary mask created using maximum resolution of the employed photolithographic process, it is understood that the primary mask may be created with a degree of resolution less than the maximum. Of course, as the resolution used to create the primary mask approaches the available maximum, correspondingly less benefit is gained by employing the process.

It should also be noted that since it impossible to create objects in the real world that, from the standpoint of abstract geometry, are perfectly parallel, perfectly equidistantly-spaced, perfectly vertical, or exactly half the width of a reference object, the term "substantially" has been used in both the specification and in the claims, to modify these adjectives and adjective phrases. That term should be understood to mean that even if perfect parallelism, verticality, equidistant spacing, and half-size reduction were the ultimate goal, they would be unachieveable. However, the effectiveness of the disclosed pitch doubling technique increases as chip geometries approach perfect parallelism, verticality, equidistant spacing, and half-size reduction. Etching and masking techniques have achieved a level of precision in the known art such that the invention may be practiced with a high degree of success by those of ordinary skill in the art.

Two types of basic etches are referred to in this disclosure. The first is an "isotropic" etch. Isotropic means that the etch proceeds in all directions at the same rate. The second type of etch is an "anisotropic" etch. Although the word denotes that the etch does not proceed in all directions at the same rate, it is generally understood in the semiconductor manufacturing industry to mean that the etch proceeds in a single direction (e.g., downwardly). Although it is technically more accurate to call a unidirectional etch either "completely anisotropic" or "ideally anisotropic", the industry-accepted vernacular will be used herein (i.e., an anisotropic etch refers to an etch that etches unidirectionally).

The primary mask (a pattern of strips, each of which has a feature width $F$, with each strip being separated from neighboring strips by a space width also equal to $F$) must be transformed into a set of mandrel strips (each mandrel strip having a feature width of $F/2$, with each mandrel strip being separated from neighboring mandrel strips by a space width equal to $3/2F$). This transformation may be accomplished in one of four ways, each of which is considered a separate embodiment of the instant process.

Figure 1:
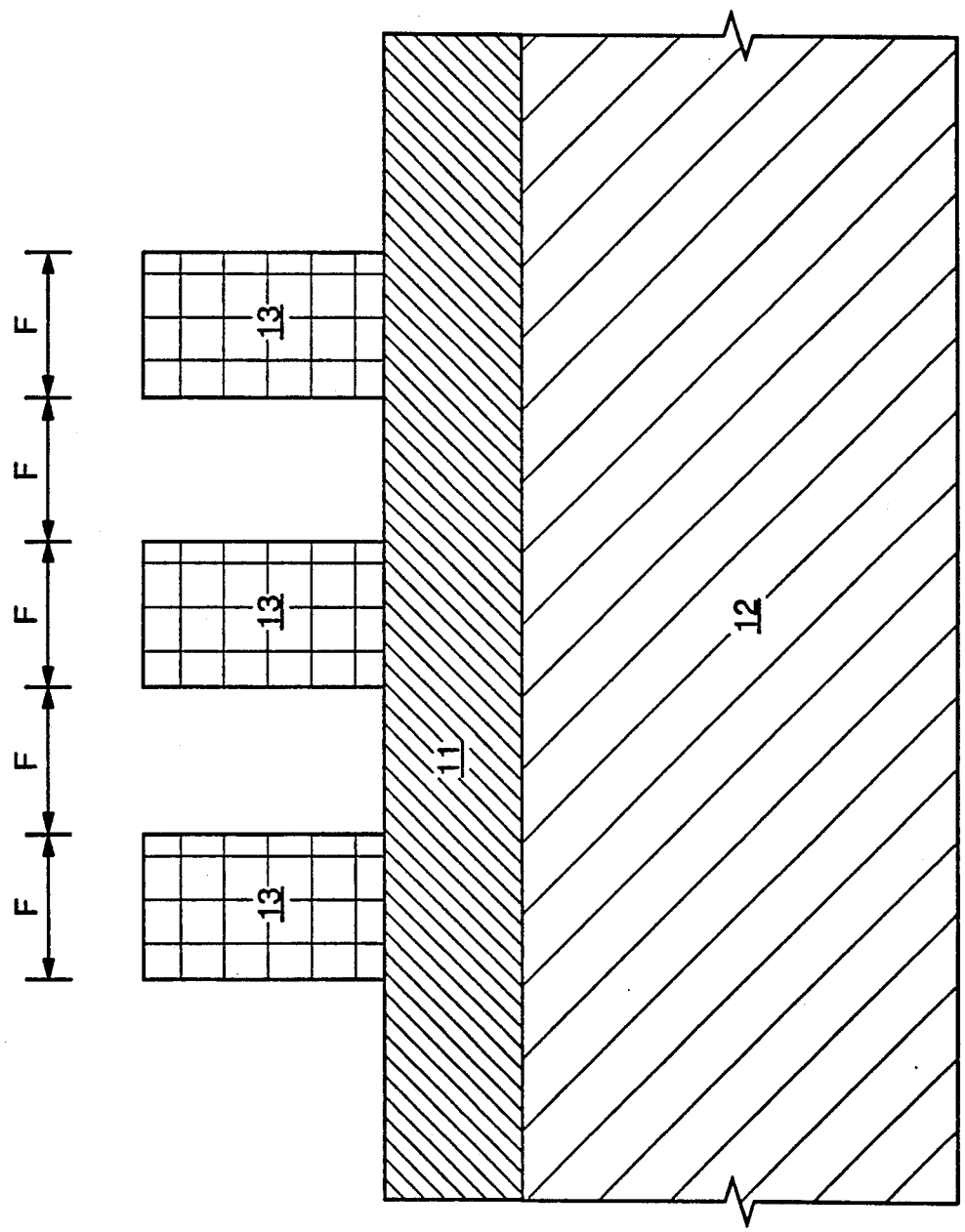
FIGS. 1 through 4 depict a first embodiment sequence for making a pattern of 1/F mandrel strips separated by 3/2F spaces.

Referring now to FIG. 1, a first embodiment sequence for creating a set of mandrel strips begins with the formation of an expendable layer 11 on a substrate 12. In the case where the substrate is silicon, the expendable layer may be silicon dioxide, silicon nitride, or polycrystalline silicon (polysilicon). In the case where the expendable layer 11 is polysilicon and the substrate is single crystal silicon, processing will be simplified if a thin etch stop layer is placed between the polysilicon expendable layer and the substrate. Additionally, in order to relieve stress between a silicon nitride expendable layer and the substrate, an optional silicon dioxide stress relief layer may be placed between the other two layers. Continuing with the process, a primary mask is then formed, preferably with photoresist resin, on expendable layer 11. The primary mask comprises parallel strips 13, each of which has a width of $F$ (the minimum feature width obtained from the employed photolithographic process). Each strip 13 is separated from adjacent strips by a space also equal to $F$.

Figure 2:
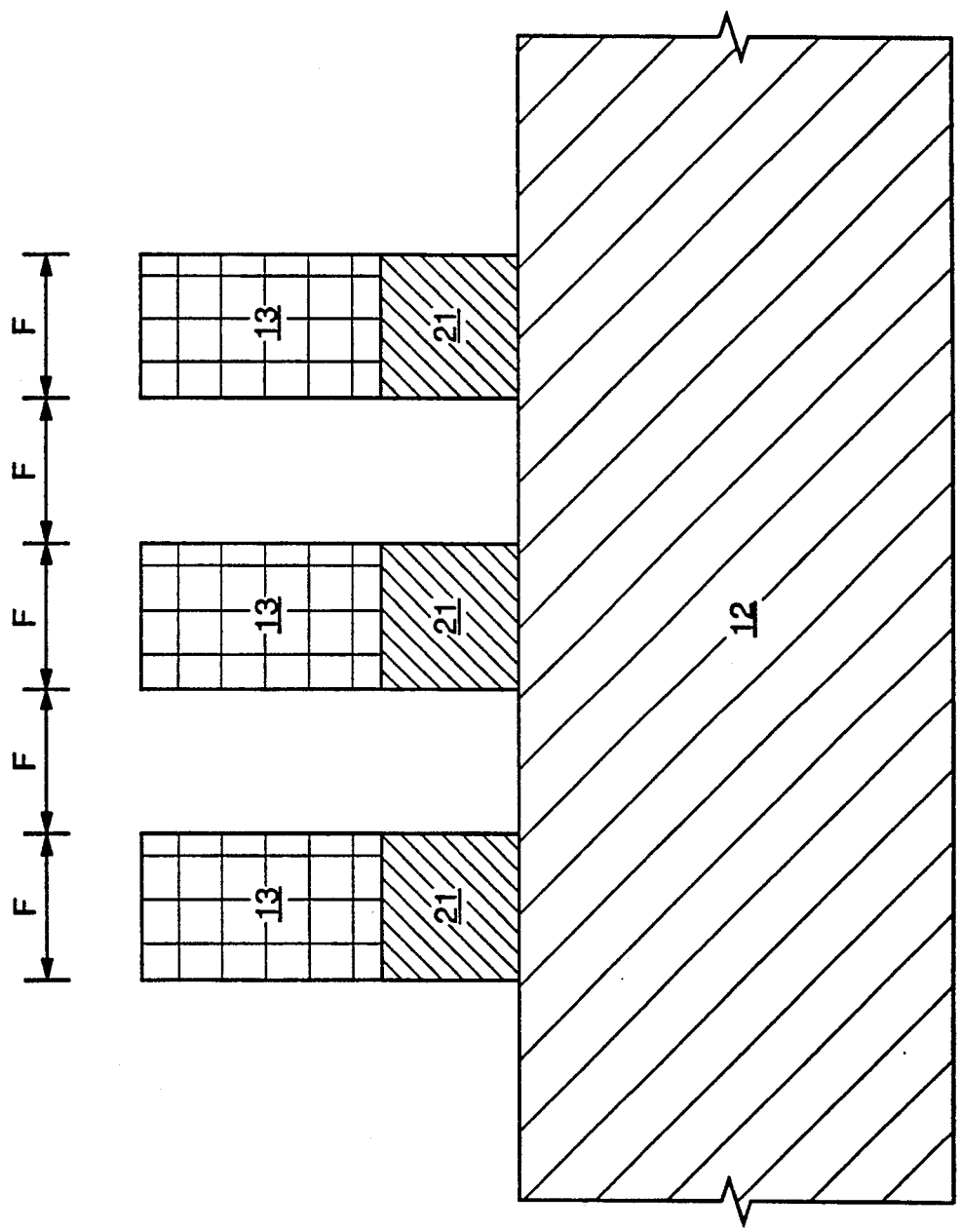

Referring now to FIG. 2, the primary mask pattern has been replicated in the expendable layer 11 using an anisotropic etch, thus creating parallel, full-width expendable layer strips 21.

Figure 3:
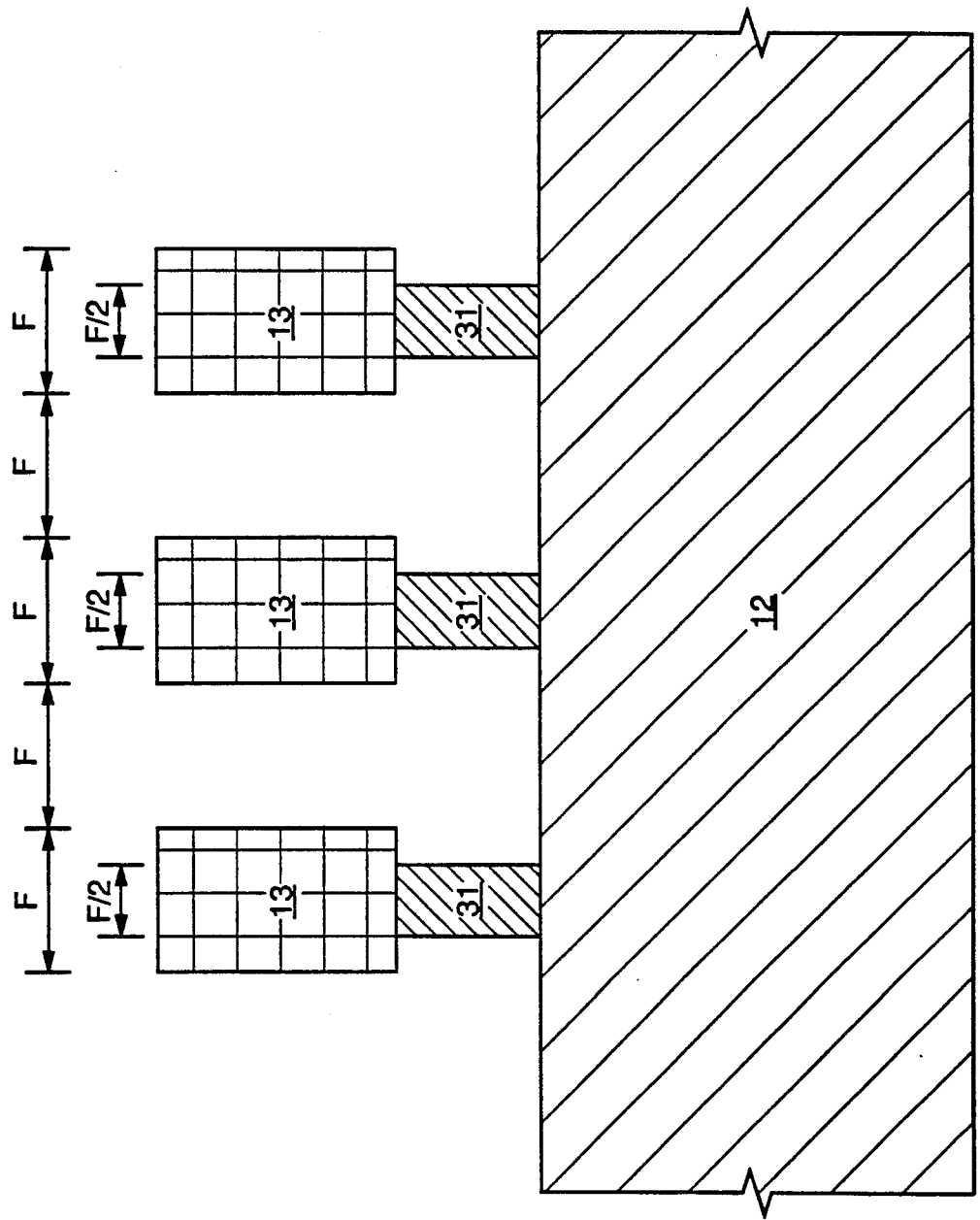

Referring now to FIG. 3, with the primary mask strips 13 still in place, expendable layer strips 21 full-width expendable strips 21 have been subjected to an isotropic etch, which results in reduced-width, mandrel strips 31.

Figure 4:
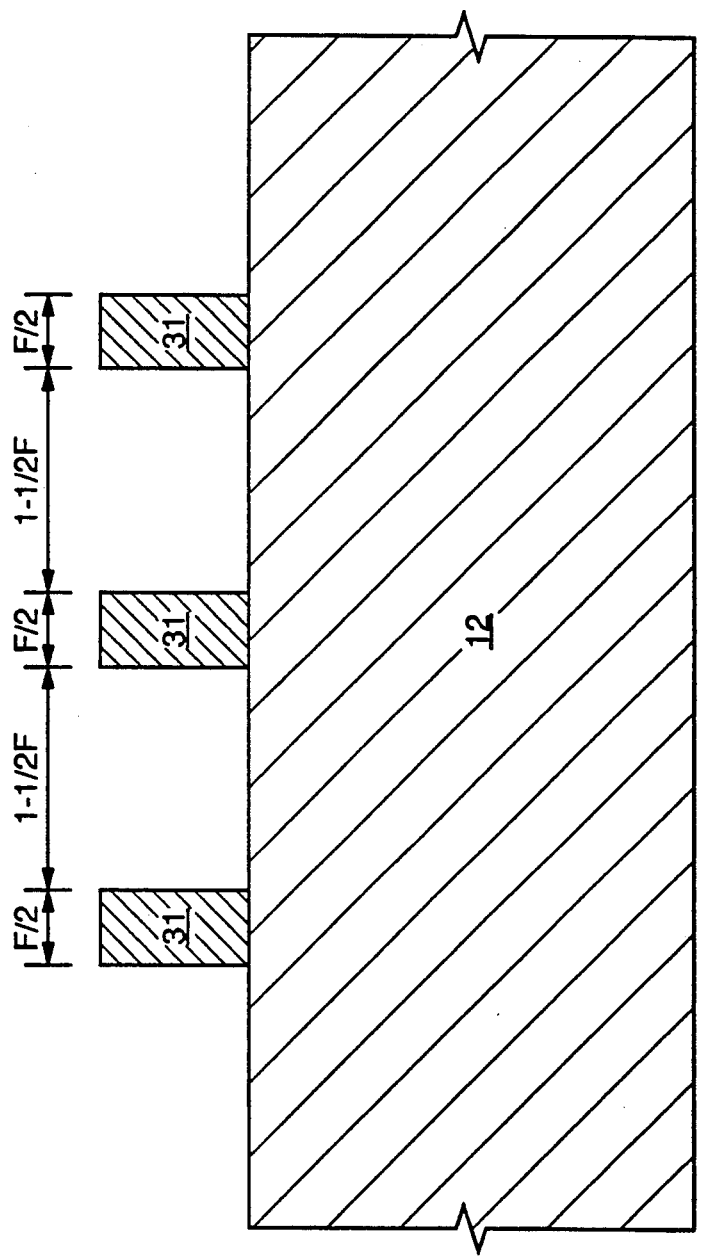

Referring now to FIG. 4, the primary mask strips 13 have been removed, leaving mandrel strips 31. Each mandrel strip has a width substantially equal to $F/2$, and is separated from neighboring adjacent strips by a space width substantially equal to $3/2F$. The process will resume with a description of FIG. 14.

Figure 5:
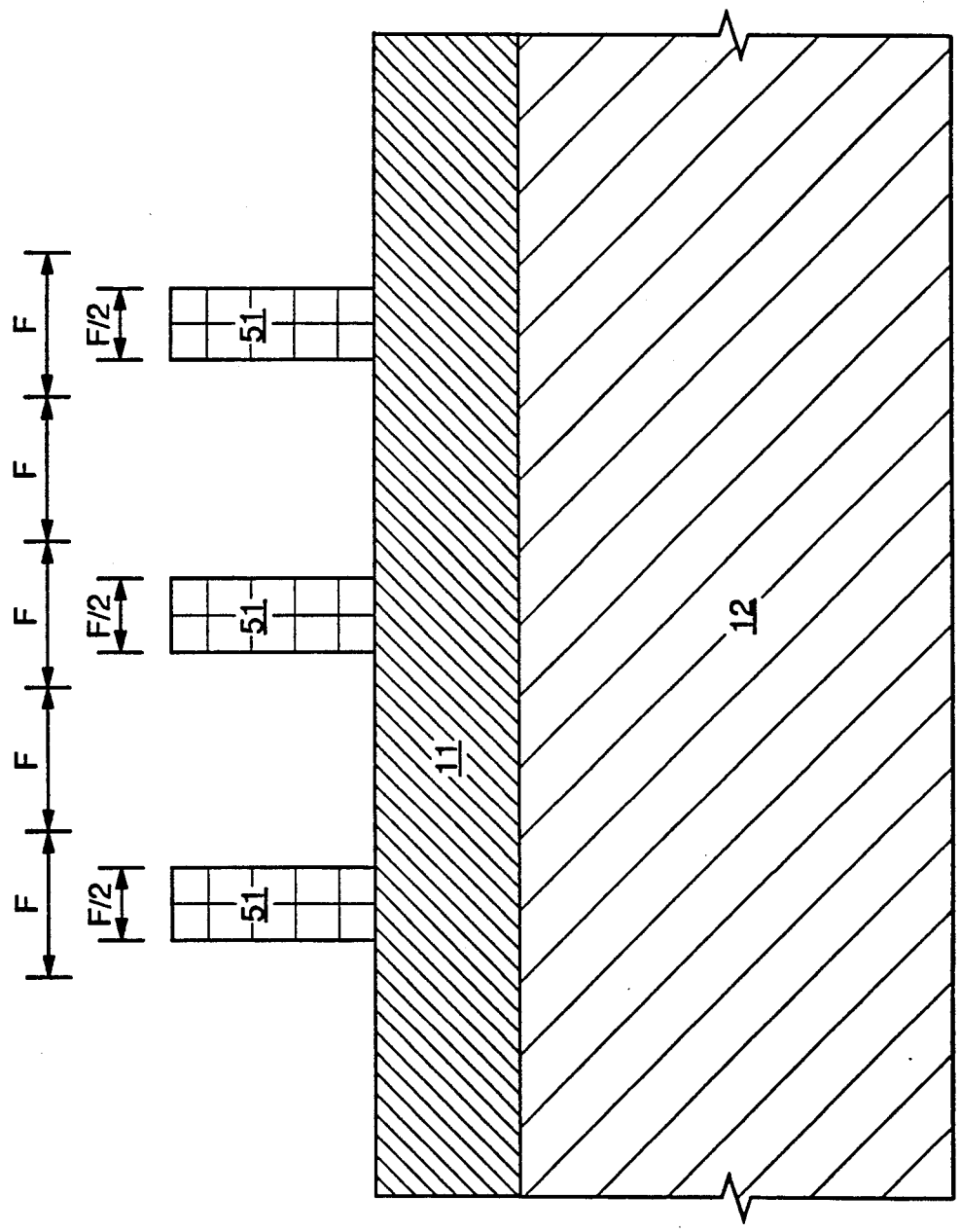

Referring now to FIG. 5, which depicts the second step in a second embodiment sequence for creating the mandrel strips equivalent to those depicted in FIG. 4, the primary photoresist mask 13 of FIG. 1 has been subjected to an isotropic etch using an oxygen plasma chemistry, which creates reduced-width photoresist strips 51, each of which has a width dimension substantially equal to $F/2$. Although the oxygen plasma etch step has also reduced the height of the photoresist strips, they still constitute a more-than-adequate etch mask.

Figure 6:
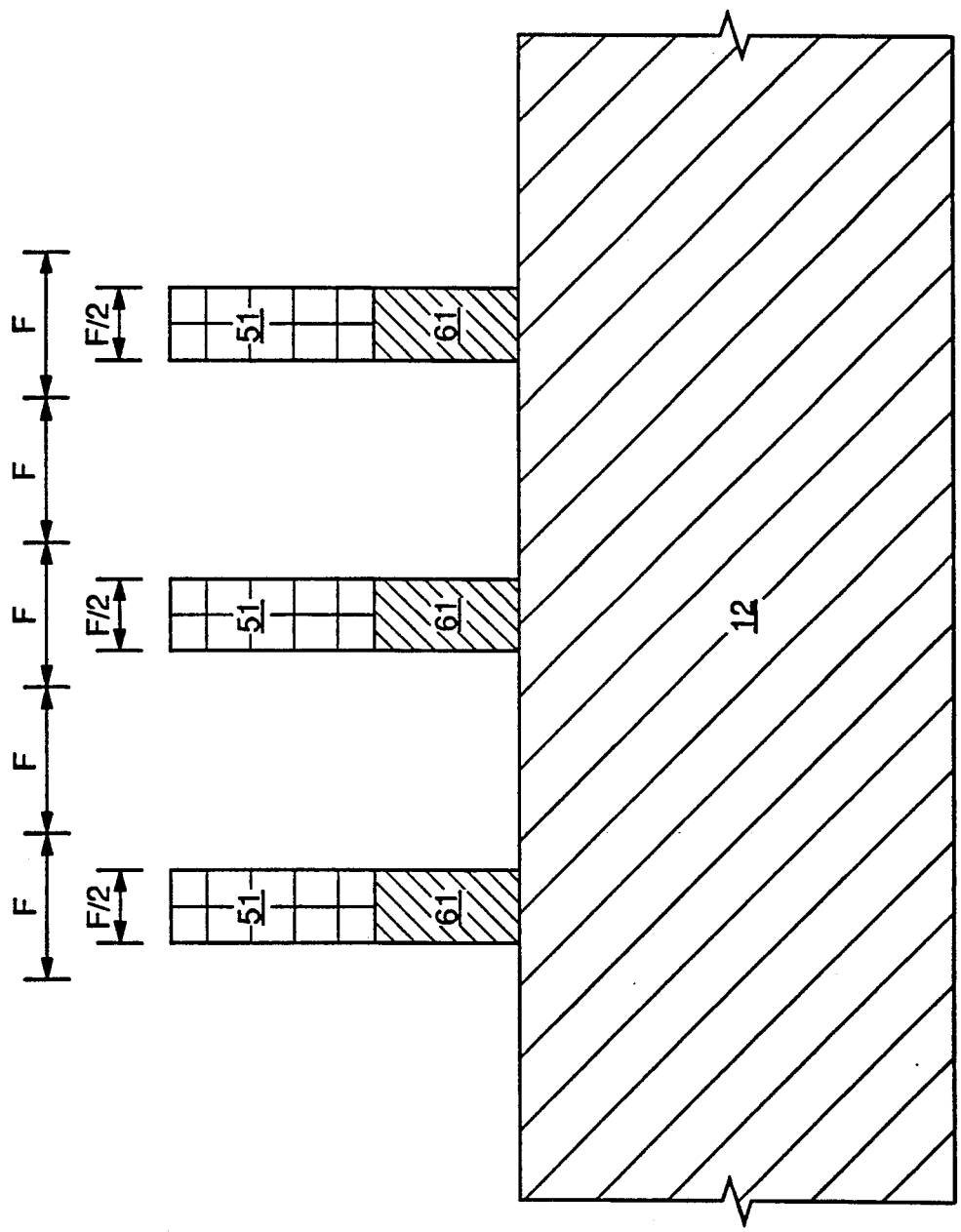

Referring now to FIG. 6, expendable layer 11 has been subjected to an anisotropic nitride etch which has removed all silicon nitride that was not subjacent reduced-width photoresist strips 51, resulting in a pattern of mandrel strips 61 that are equivalent to the mandrel strips 31 of FIG. 4. Once again, each mandrel strip has a width substantially equal to $F/2$, and is separated from neighboring adjacent strips by a space width substantially equal to $3/2F$. The process will resume with a description of FIG. 14.

Figure 7:
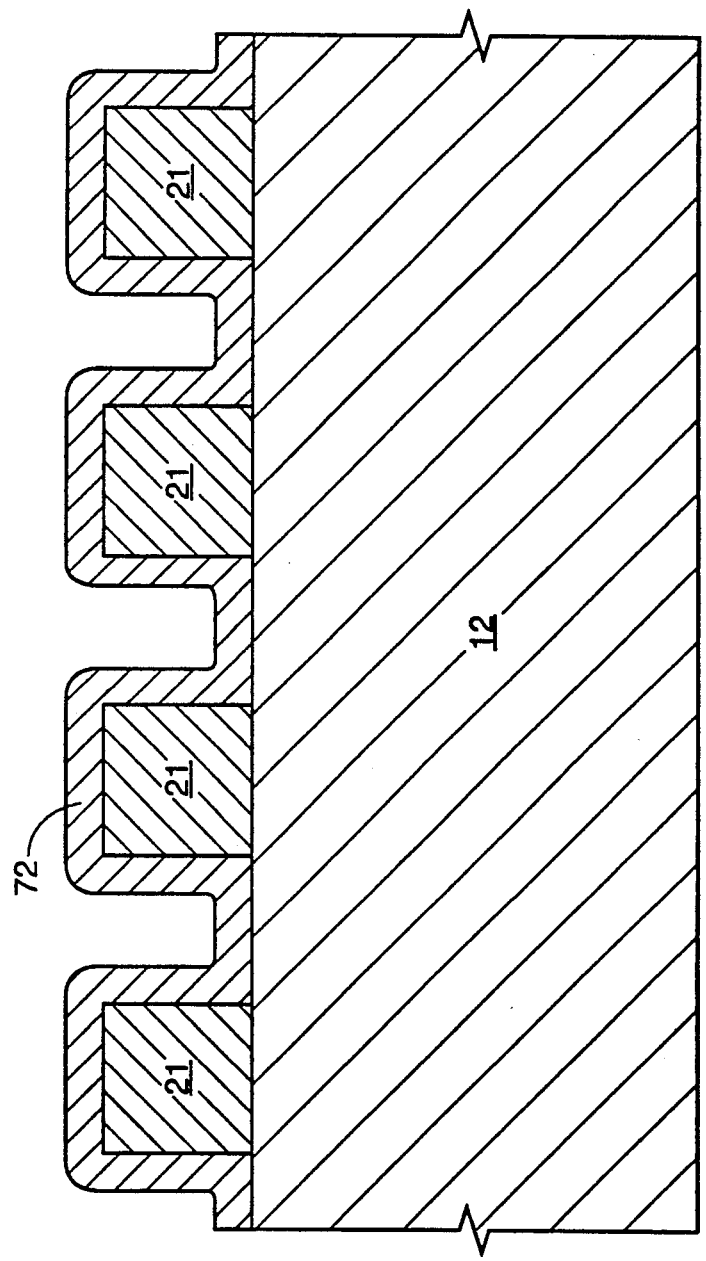

Referring now to FIG. 7 (which depicts the third step in a third embodiment sequence for creating the mandrel strips equivalent to those depicted in FIG. 4), a thin, fully-expendable spacer layer 72, having a thickness substantially equal to $\frac{1}{4}F$, is conformally deposited over the structure of FIG. 2. It should be mentioned at this point that it will later be necessary to etch away both the expendable layer strips 21 and remnants of the thin spacer layer 72 simultaneously. Therefore, processing is simplified if the thin spacer layer and the expendable layer are formed from the same material (e.g., silicon nitride or polycrystalline silicon).

Figure 8:
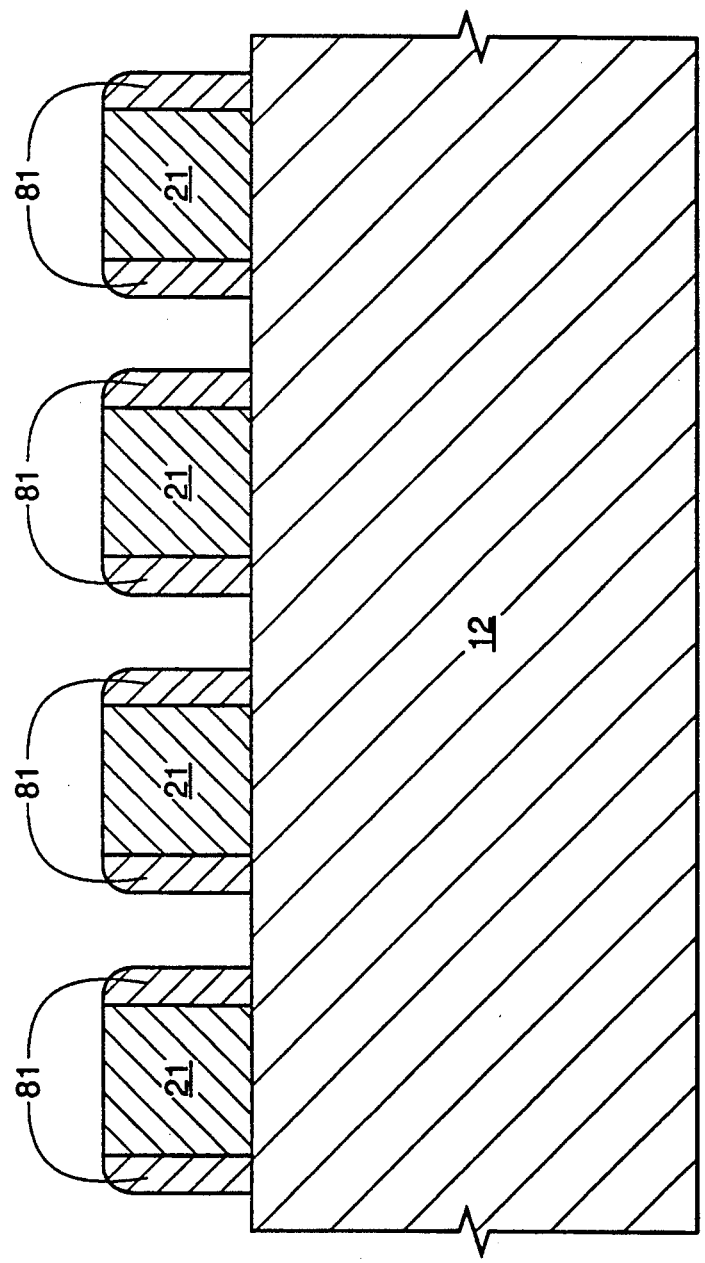

Referring now to FIG. 8, the thin spacer layer is anisotropically etched to form thin, $\frac{1}{4}F$-thick spacers 81 on the sidewalls of the full-width expendable layer strips 21. More importantly, this etch step also clears the substrate 12 between each pair of spacer-widened expendable layer strips.

Figure 9:
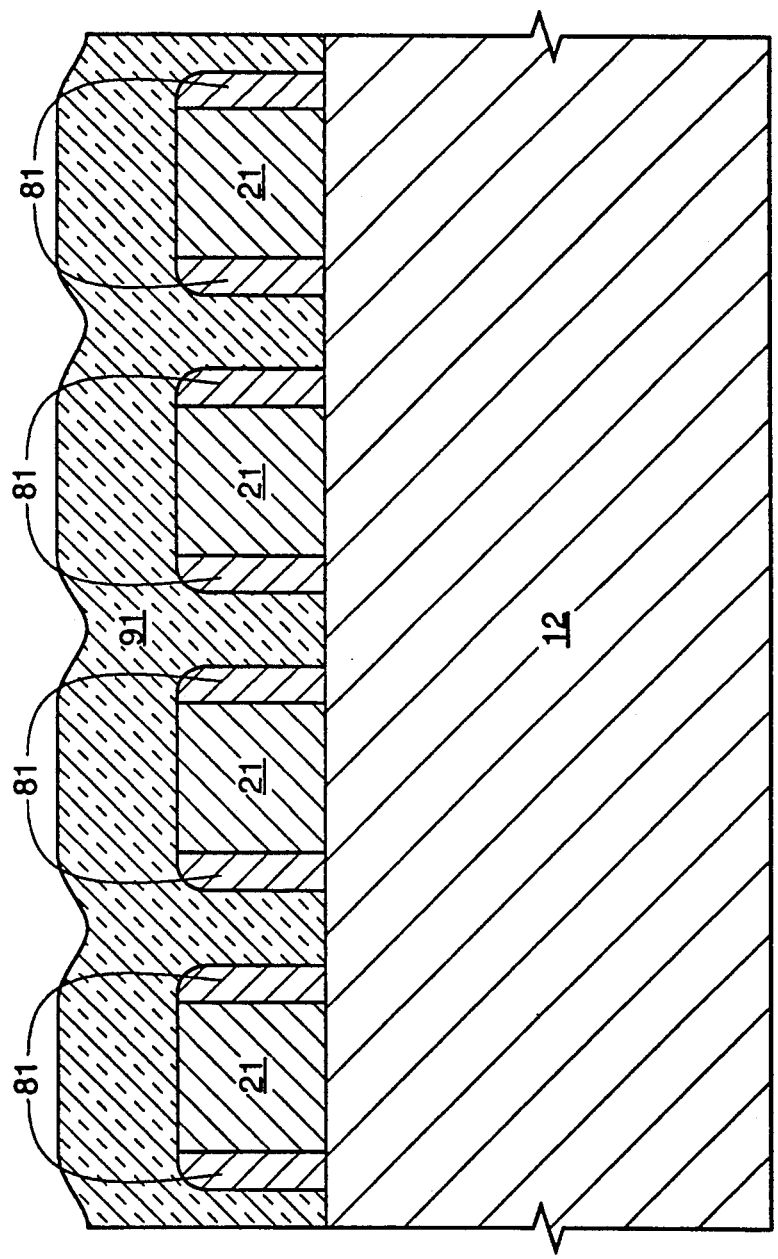

Referring now to FIG. 9, a spin-on filler layer 91 is deposited over the structure of FIG. 8. Materials such as spin-on glass (SOG) or even photoresist may be used for the spin-on layer. The use of photoresist requires special considerations, which are addressed in the description of FIG. 13.

Figure 10:
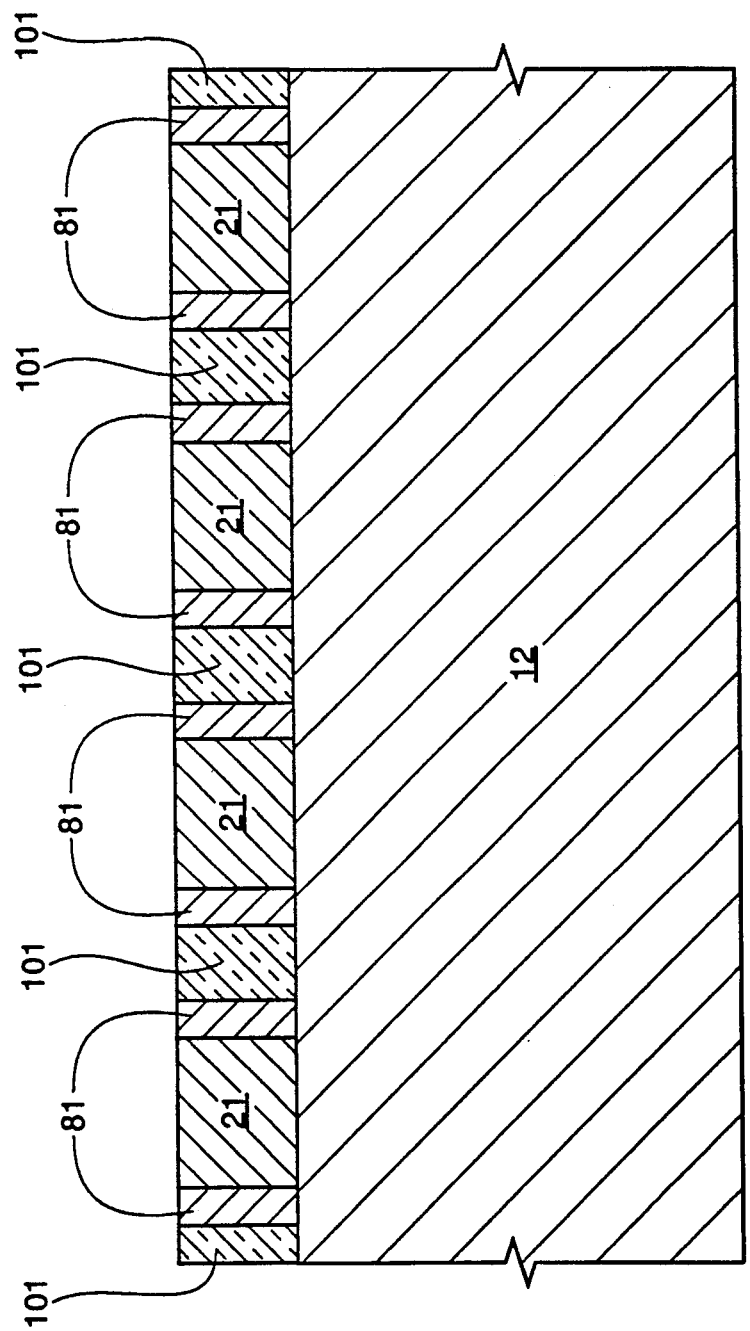

Referring now to FIG. 10, the spin on layer is either etched back or planarized so that the upper surfaces of both the expendable material strips 21 and the thin spacers 81 are exposed. If SOG is used for the spin-on layer, a chemical-mechanical planarization step will provide the desired structure. On the other hand, if photoresist is used for the spin-on layer, a planarizing etch-back using, for example, an oxygen plasma chemistry, will provide an equivalent structure.

Figure 11:
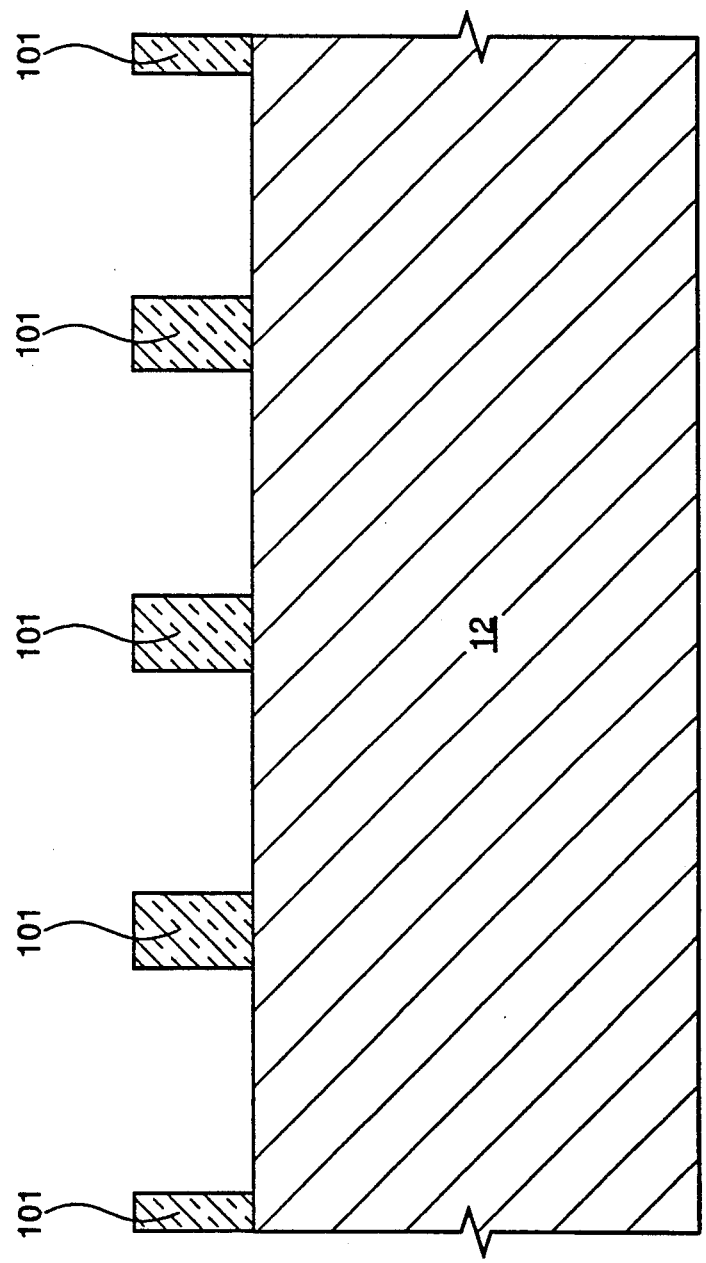

Referring now to FIG. 11, the remnants of both the expendable layer (i.e., full-width expendable strips 21) and the ¼F-thick fully-expendable spacer layer (i.e., thin spacers 81) have been removed to leave a set of parallel mandrel strips, each of which has a width of F/2 and is separated from adjacent strips by a space equal to 3/2F. The process will resume with a description of FIG. 14.

Figure 12:
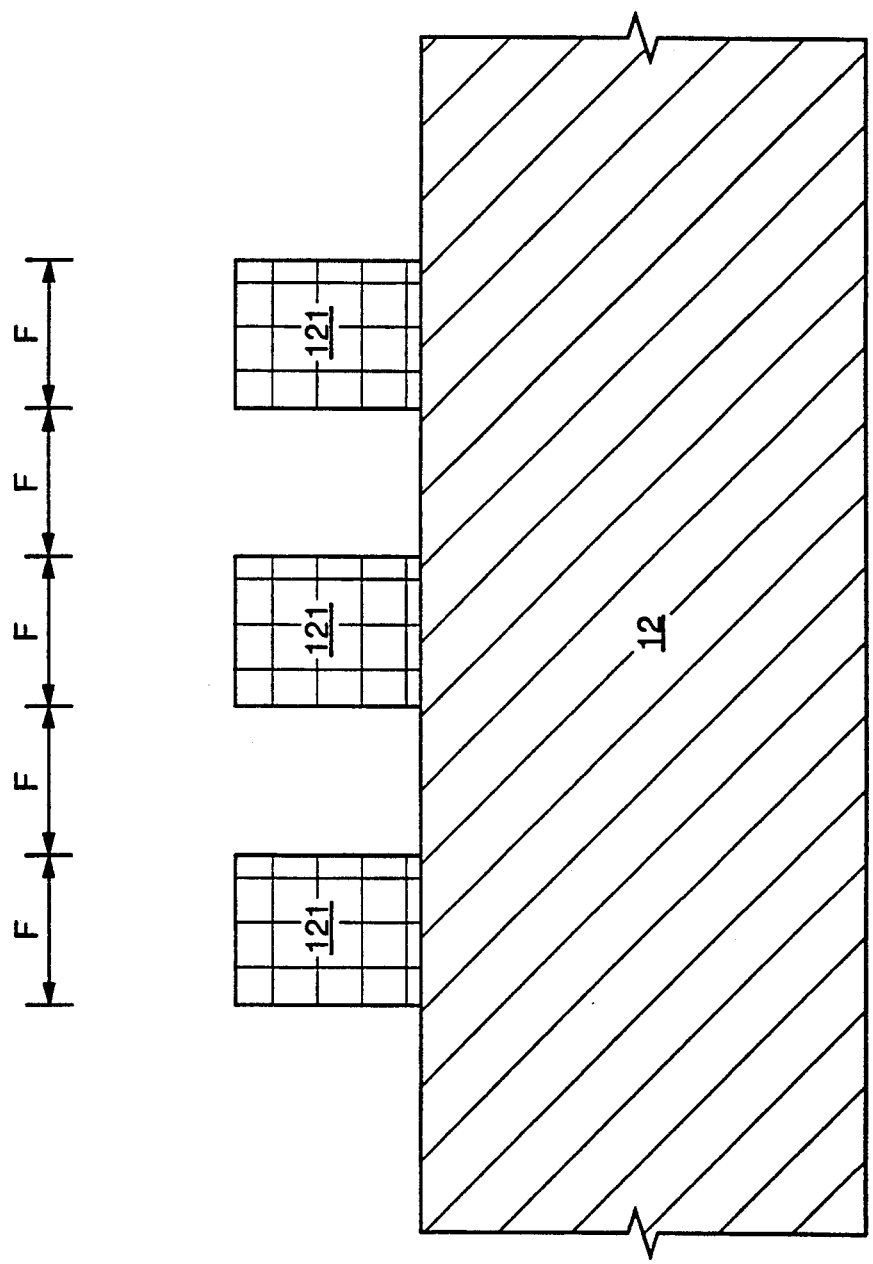

Referring now to FIG. 12, which depicts the first step in a fourth embodiment sequence for creating the mandrel strips equivalent to those depicted in FIG. 4, the substrate 12 has been masked with a primary mask consisting of a pattern of photoresist strips 121 of substantially identical width, separated by gaps substantially equal to the width of the photoresist strips.

Figure 13:
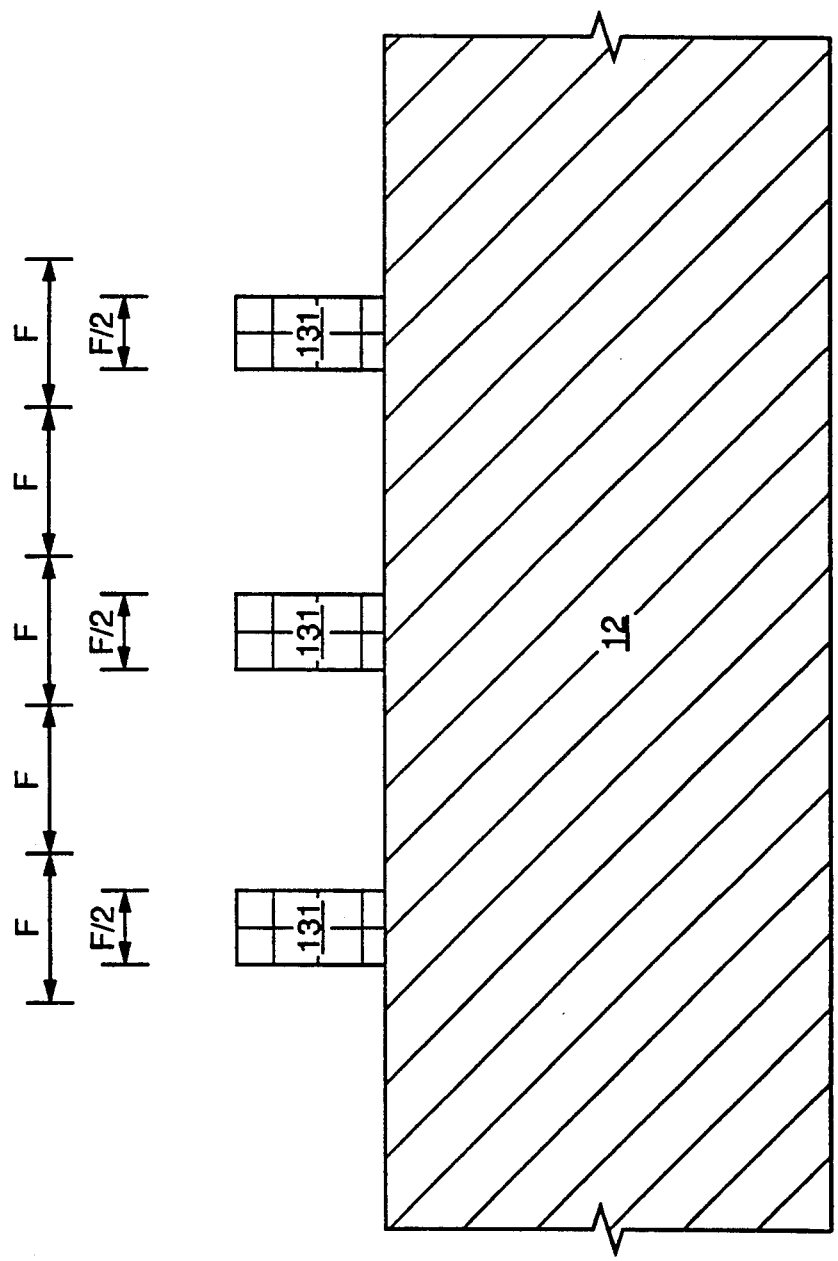
FIGS. 13 through 17 depict a sequence for converting the mandrel strips, created using one of the foregoing four embodiment sequences, into a half-pitch pattern.

Referring now to FIG. 13, the primary photoresist mask strips 121 are subjected to an isotropic oxygen plasma etch, which reduces the height and, most importantly, the width of the photoresist strips, resulting in reduced-with mask strips 131, which can, with certain limitations, be utilized directly as equivalents to the mandrel strips of FIG. 4. Due to a relatively low decomposition temperature of photoresist, only low temperature deposition processes may be utilized to deposit conformal layers thereon. U.S. Pat. No. 4,838,991, issued to William J. Cote, et al, teaches a process for depositing paralene (an organic layer) on an organic mandrel. Conformal layers of poly tetrafluoroethylene (teflon) and other fluorocarbon polymers may also be deposited at temperatures compatible with organic mandrels, such as photoresist. The deposition of fluorocarbon polymer layers on top of photoresist is disclosed in U.S. Pat. No. 4,528,066, which issued to Robert Merkling, Jr. and David Stanasolovich.

Figure 14:
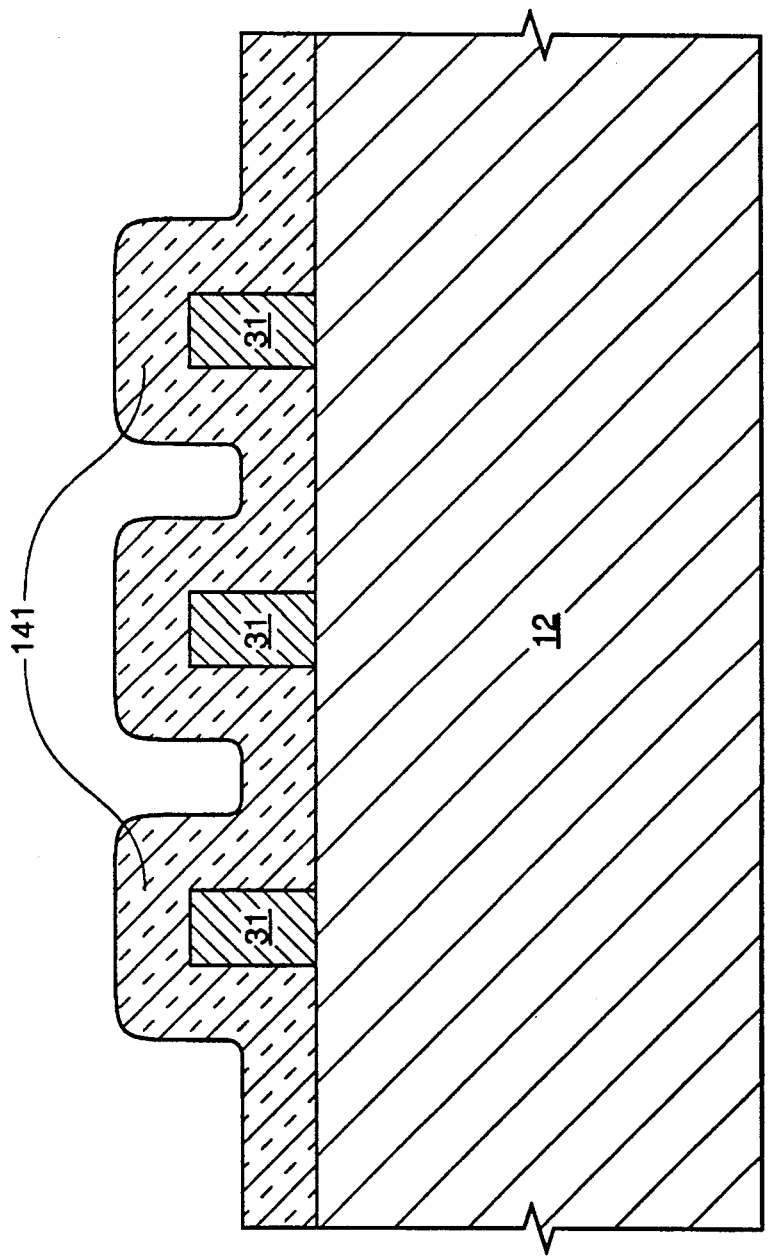

Referring now to FIG. 14, a partially-expendable stringer layer 141, having a thickness of F/2, has been conformally deposited over the mandrels (31, 61, 101, and 131 are equivalent structures) formed by one of the four sequences heretofore described.

Figure 15:
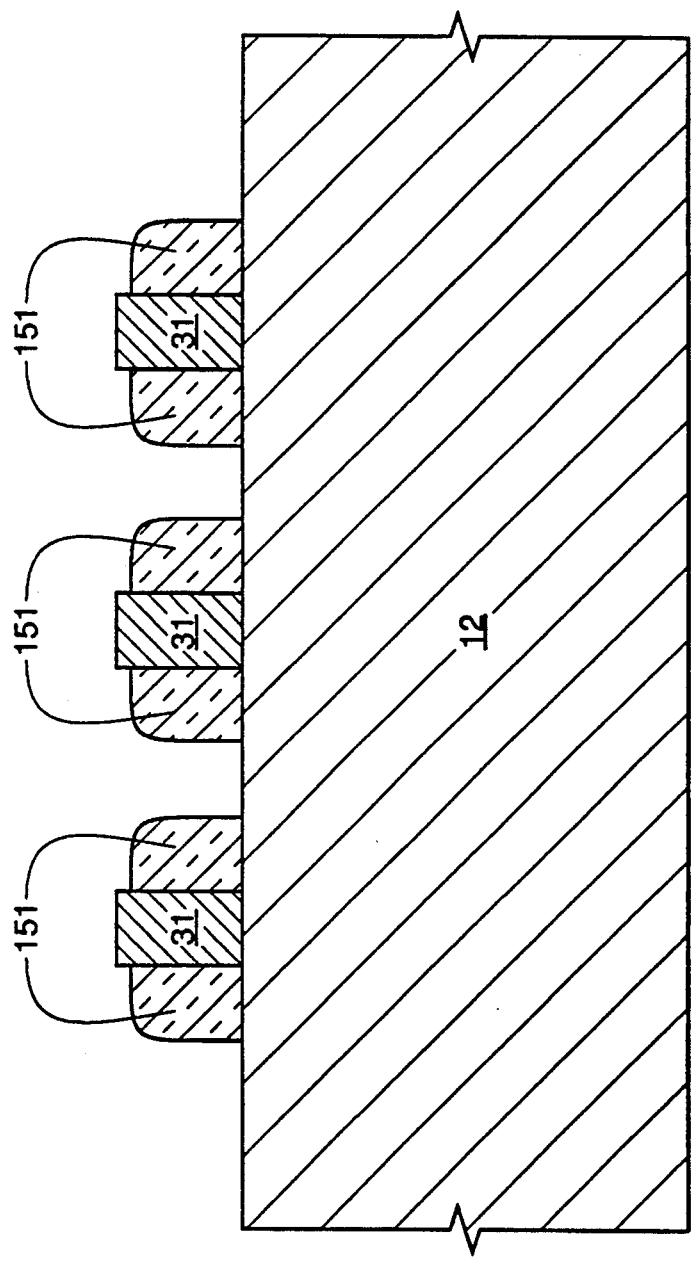

Referring now to FIG. 15, F/2-thick stringer layer 141 has been anisotropically etched to form F/2-thick stringer strips 151 on the sidewalls of mandrels 31.

Figure 16:
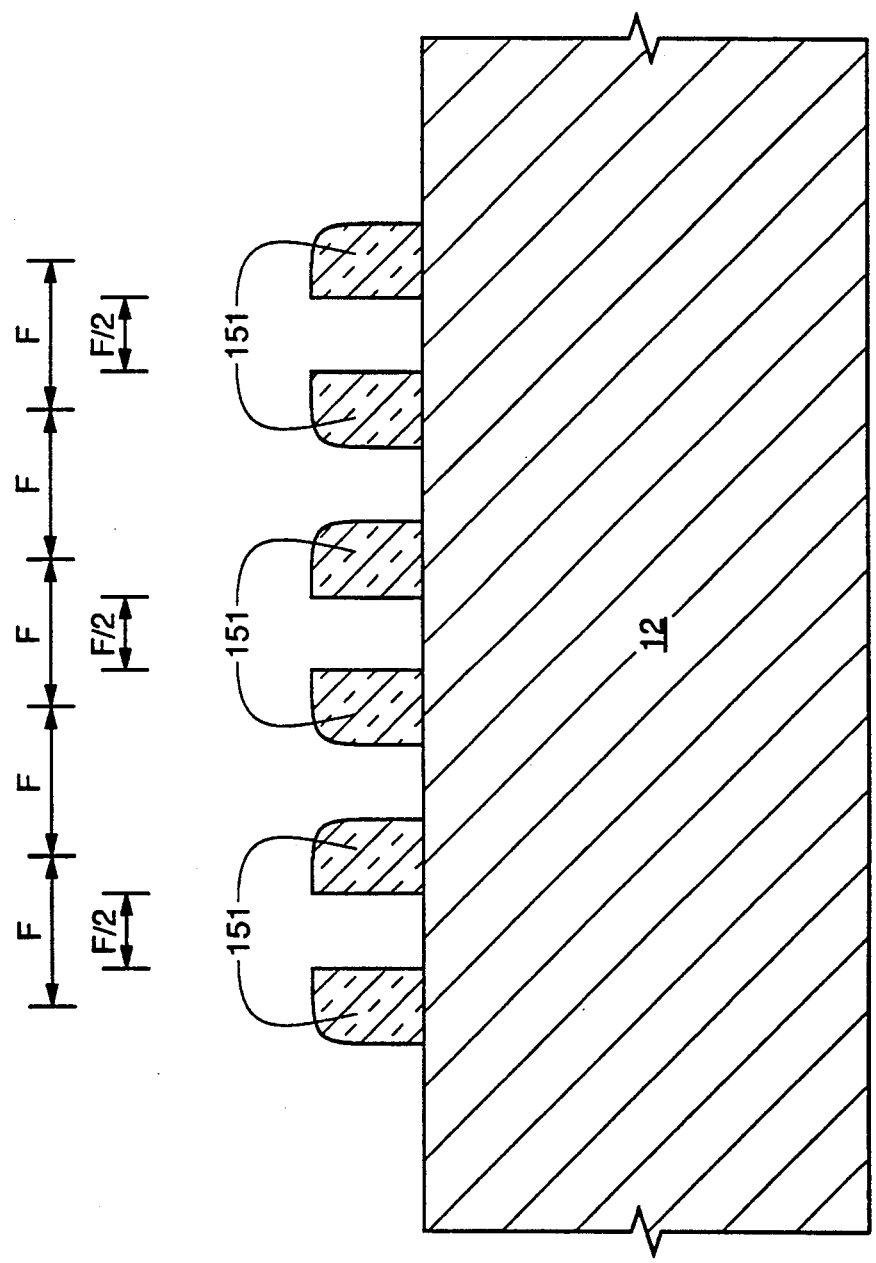

Referring now to FIG. 16, mandrel strips 31 have been removed. Normally, this will be accomplished with a wet etch that selectively etches the mandrel strip material, but does not attach either the F/2-thick stringer strips 151 or the substrate 12. If the mandrel strips are photoresist, then a photoresist strip will remove them. If the materials from which the stringer strips have been appropriately selected, they may serve as the final pitch-doubled product. For example, if they were formed from a polysilicon stringer layer and a gate oxide layer was formed prior to the deposition of the polysilicon stringer layer, the stringer strips could serve as transistor gates. Alternatively, the stringer strips may be used as a mask to pattern the underlying layer (in this case substrate 12).

Figure 17:
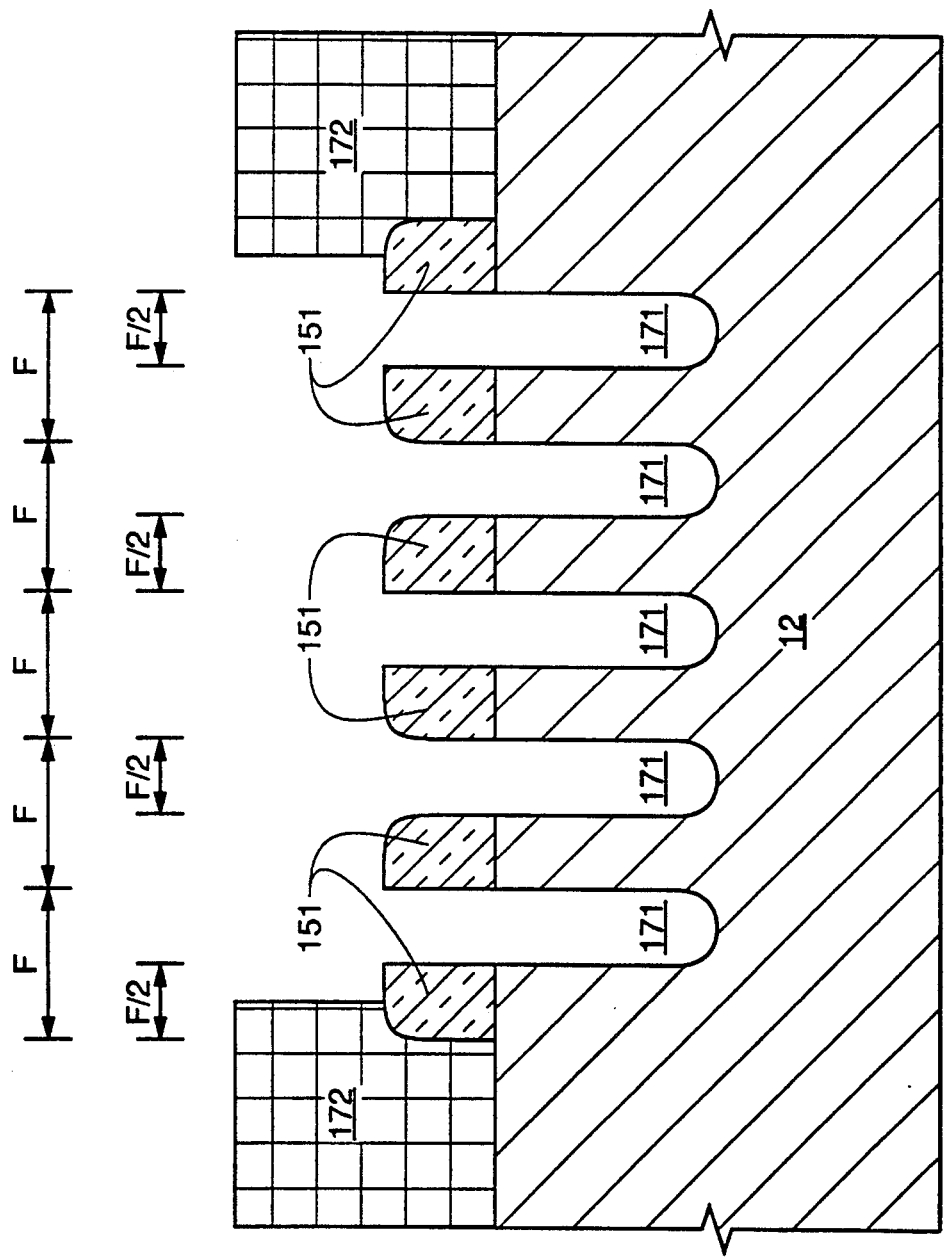
Figure 18:
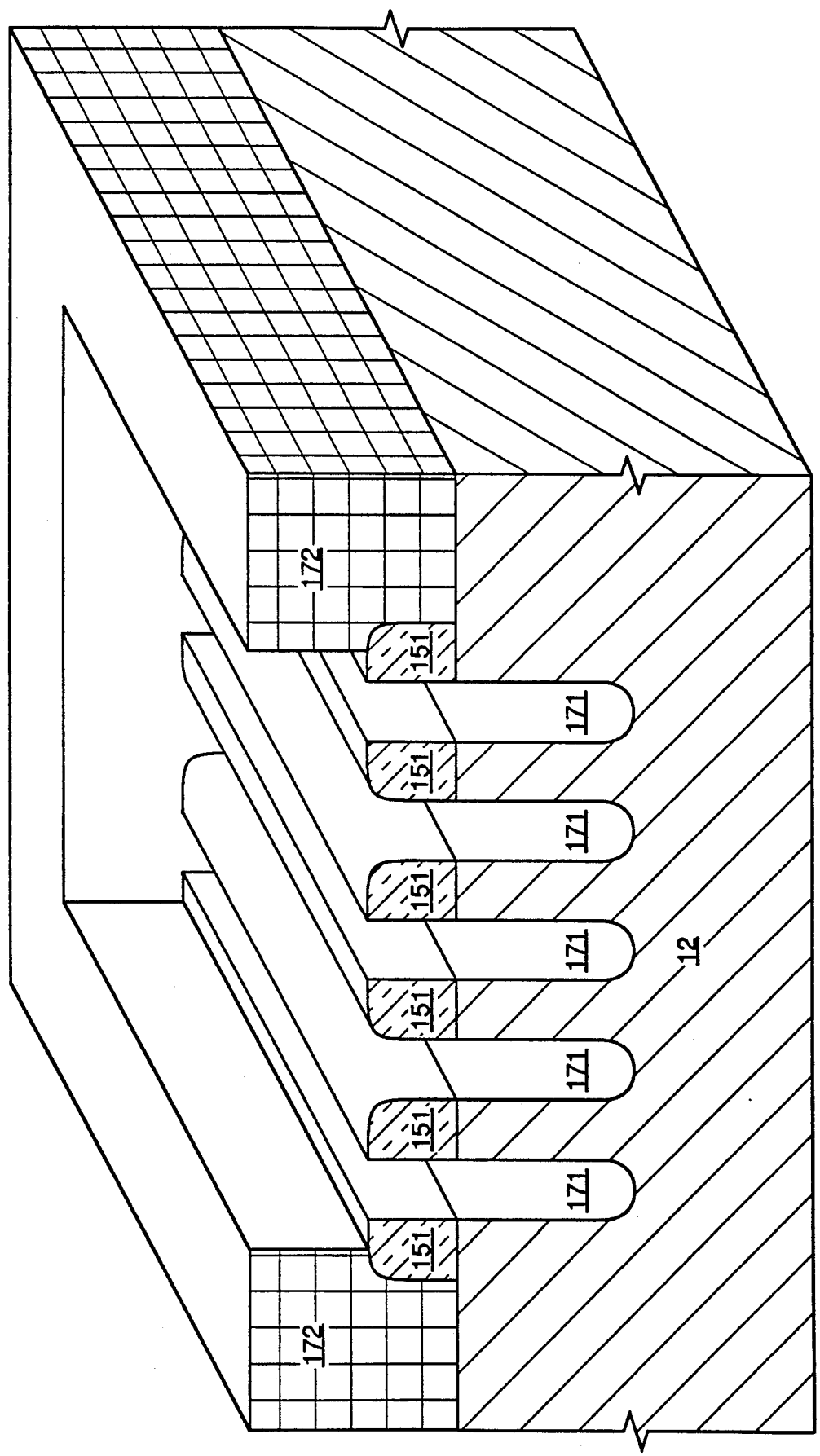
FIGS. 18 through 22 depict a sequence for converting the half-pitch pattern created in FIGS. 13 through 17 into a quarter-pitch pattern.

Referring now to FIG. 17, a peripheral mask 172 mask has been applied to the periphery of the stringer strip pattern. Then using both peripheral mask 172 and stringer strips 151 as an etch mask, the substrate is etched to create trenches 171. An isometric view of the FIG. 17 structure is depicted in FIG. 18.

FIGS. 19 to 23 depict a repeat of the process using the half-pitch pattern of stringer strips in place of the primary mask of FIG. 1. Repeating the process results in a quarter-pitch pattern of stringer strips.

Figure 19:
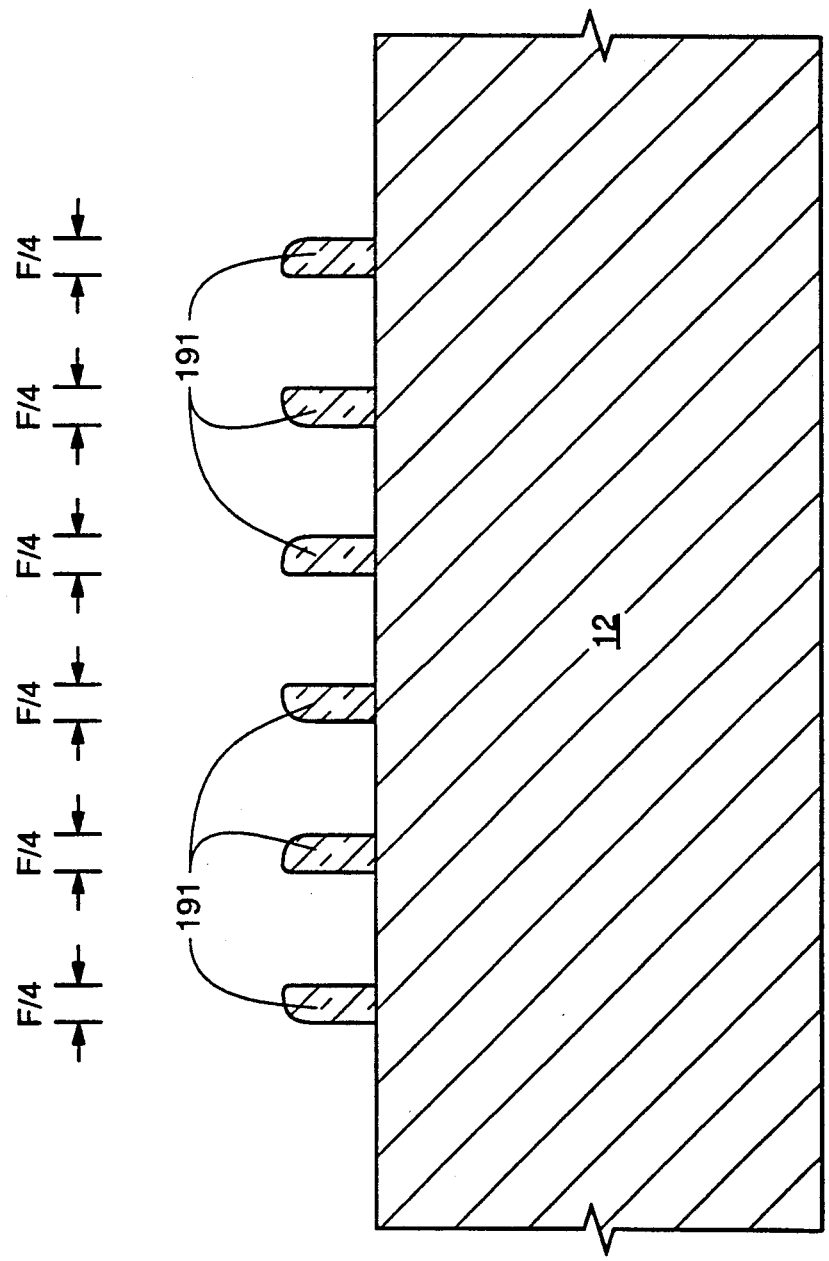

Referring now to FIG. 19, the F/2-wide stringer strips of FIG. 16 have been subjected to an isotropic etch, resulting in a second order set of mandrel strips 191, each of which has a width of F/4 and is separated from adjacent strips by a 3/4F space.

Figure 20:
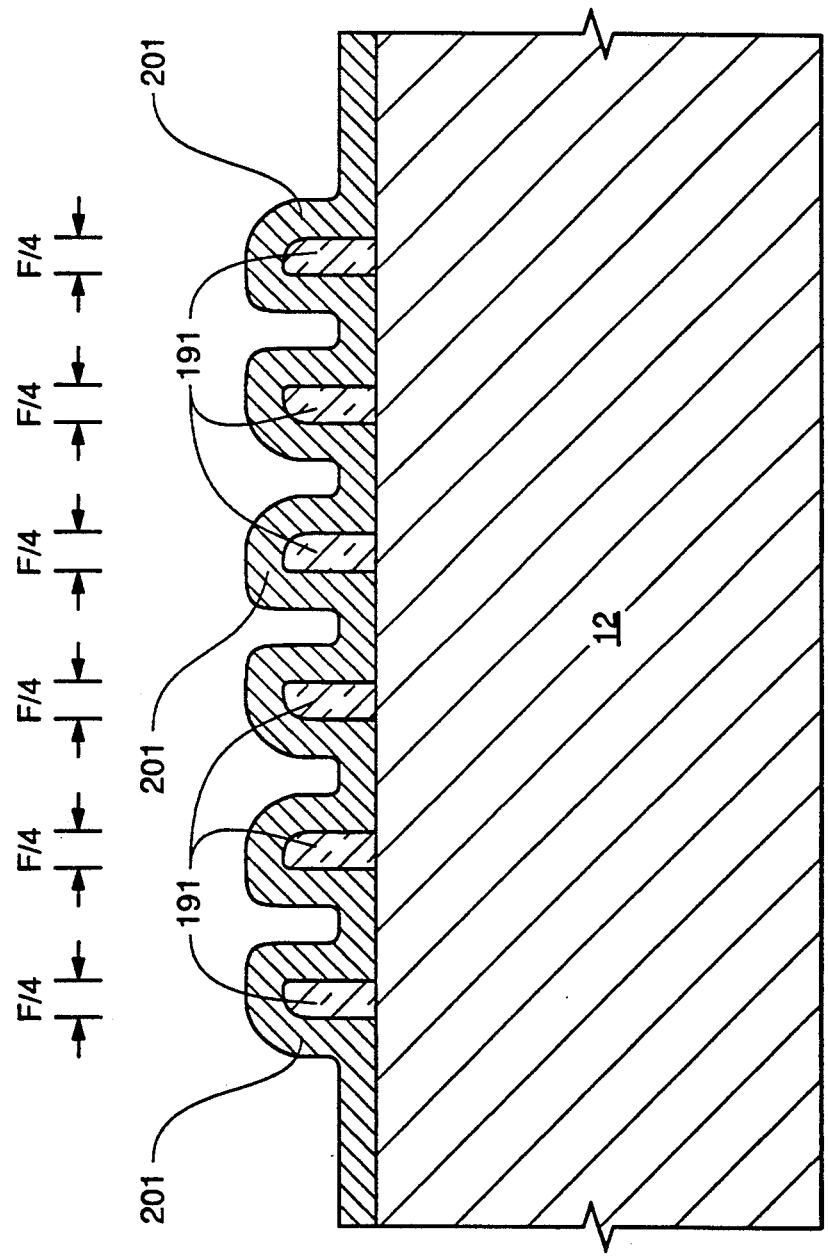

Referring now to FIG. 20, a second order stringer layer 201 having a thickness of F/4 has been conformally deposited over the structure of FIG. 19.

Figure 21:
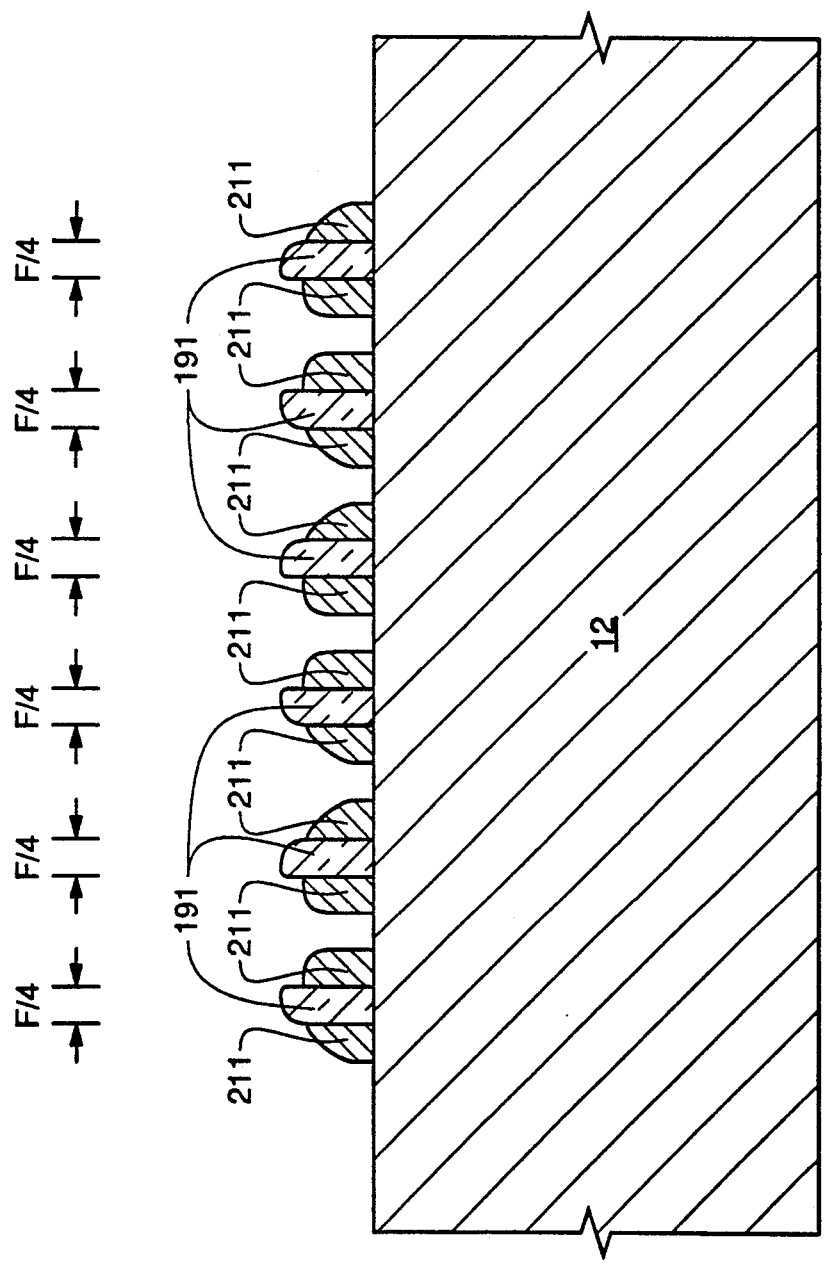

Referring now to FIG. 21, an anisotropic etch of the second order conformal stringer layer 201 has resulted in a pattern of second order stringer strips 211 on the vertical sidewalls of the second order mandrel strips 191.

Figure 22:
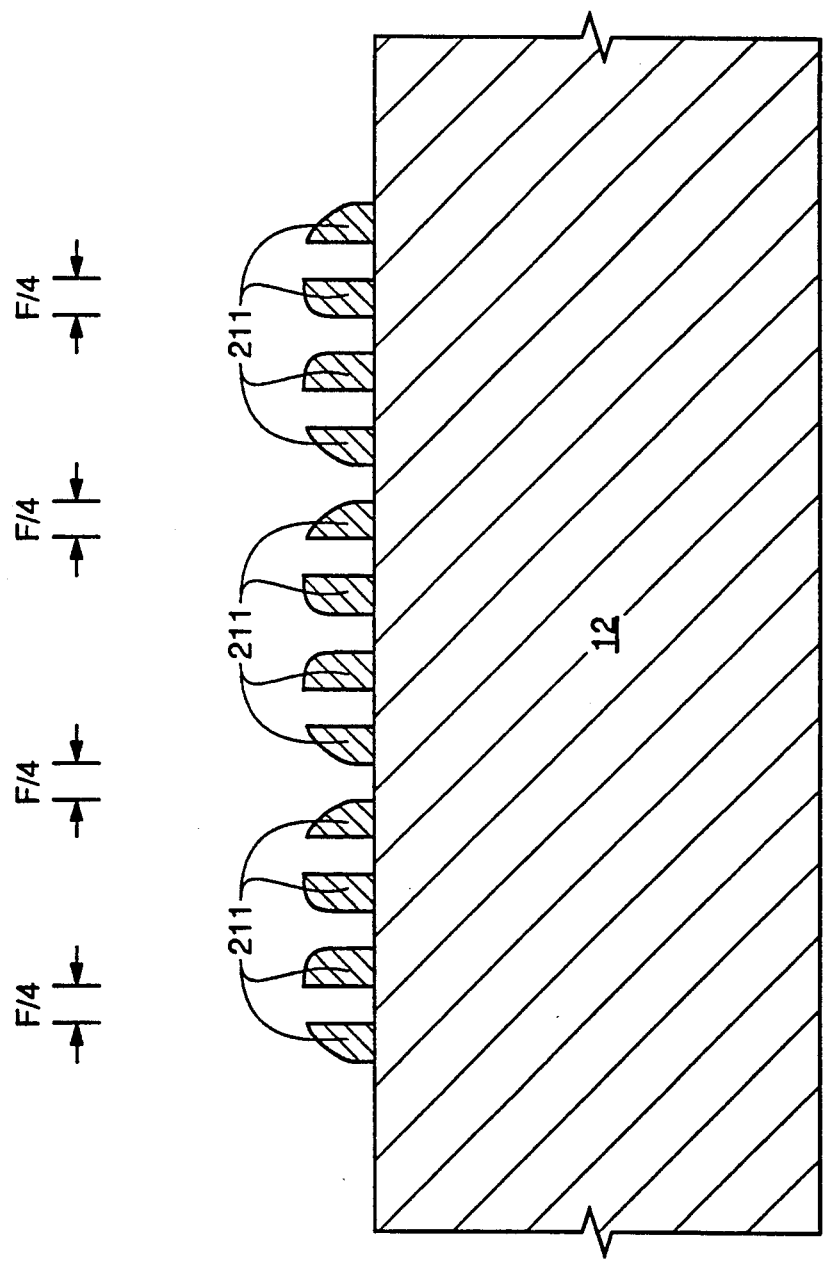

Referring now to FIG. 22, the second order mandrel strips have been removed via a selective etch, leaving only the pattern of second order stringer strips superjacent substrate 12. This pattern of second order stringer strips 211 is a quarter-pitch structure in that each strip has a width of F/4 and is separated from adjacent strips by a space of F/4.

Figure 23:
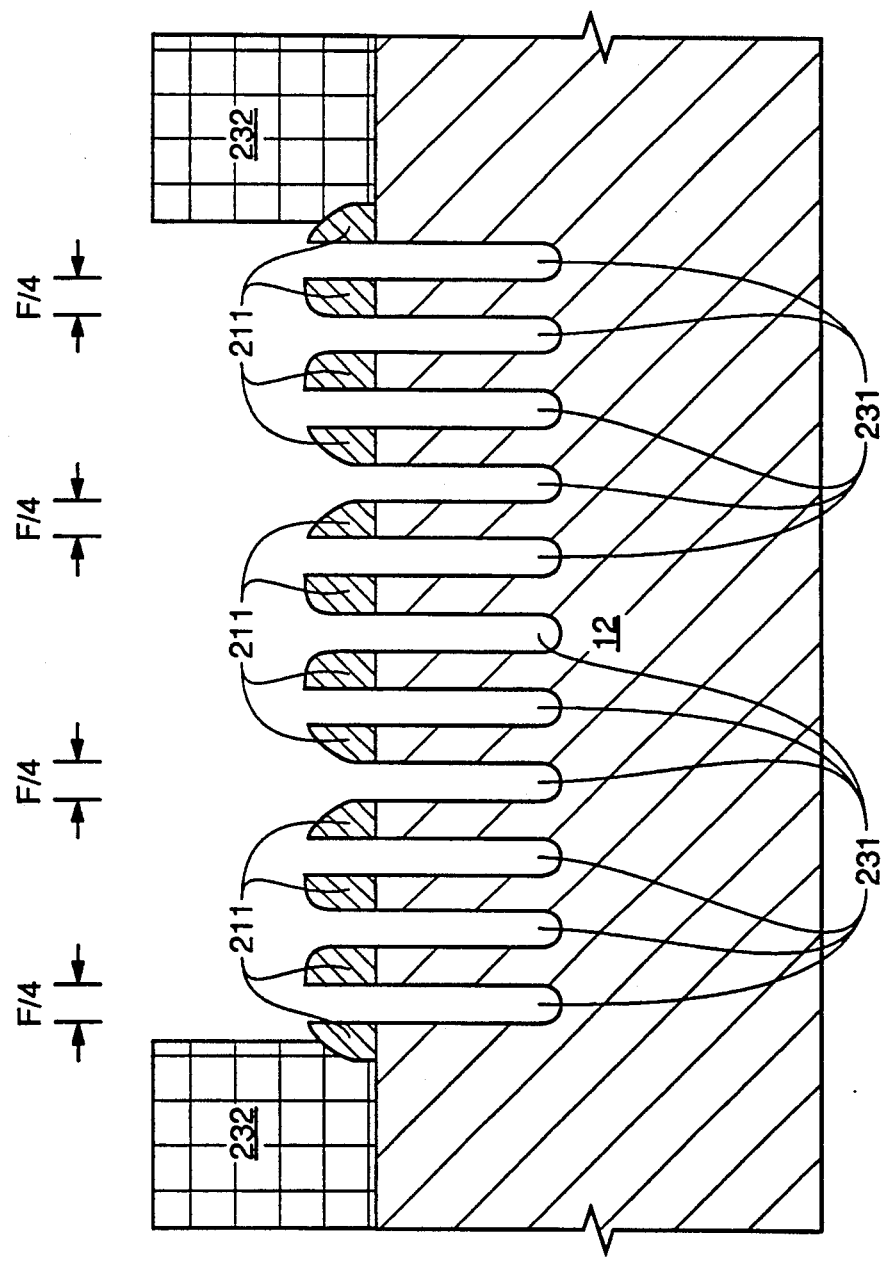
FIG. 23 is a cross-sectional view of the structure of FIG. 22 following the creation of a peripheral mask and a subsequent anisotropic etch of the substrate using the quarter-pitch pattern as a mask.

Referring now to FIG. 23, a peripheral mask 232 has been created about the periphery of the pattern of second order stringer strips 211 and the substrate has been etched using peripheral mask 232 and the second order stringer strips 211 as etch masks. The etch creates a pattern of quarter pitch trenches 231 in the substrate 12.

Although a series of processes must necessarily begin with a photolithography step, the material masked with photoresist may be any material (e.g. oxide, polysilicon or nitride). As long as a pair of dissimilar materials are used for the conformal stringer layer and the strips which reflect the pattern of the photoresist (silicon nitride in the doubling example above), the strips which reflect the photoresist pattern may be selectively etched following an anisotropic etch of the conformal stringer layer to leave a masking pattern formed from remnants of the conformal stringer layer. Of course, the material which comprises the masking pattern must also permit selective etching of the underlying layer with little or no consumption of the mask material.

Although only several embodiments of the present invention have been described herein, it will be apparent to one of ordinary skill in the art, that changes may be made thereto without departing from the spirit and the scope of the process as claimed.

For example, U.S. Pat. No. 4,436,584, entitled "Anisotropic Plasma Etching of Semiconductors" and issued to Stephen E Bernacki, et al, describes a technique for determining the conditions of photoresist sidewall geometry required for polymer film formation during plasma etches using halocarbon etch chemistries. The polymer film, which will form as long as the sidewalls of the resist mask are not sloped beyond a "critical angle", prevents lateral etching of the edges of the photoresist and sidewalls of the film being etched. If primary masks having sloped walls within Bernacki's critical angle are used to practice this invention, then feature width measurements must be taken at the base of the photoresist mask.

Another variation that is considered to be within the scope of the invention, as claimed, is the use of the process to double the pitch of a pattern of concentrically curving strips. In this sense, the definition of the word "parallel" is consistent with the both the geometric concept of parallel straight lines, as well as the concept of parallel lines of latitude about the globe. Thus, it is intended that this invention encompass, not only a pattern of straight strips, but also patterns of strips incorporating one or more concentric curves throughout their length, as well as concentric strips (bands).

We claim:

1. A method for manufacturing an integrated circuit, comprising the following sequence of steps:
   (a) forming a primary mask strip, said mask strip having a first feature width;
   (b) transforming the primary mask strip into a mandrel strip, said mandrel strip having substantially vertical sidewalls and a second feature width that is less than said first feature width;
   (c) forming stringer strips on the sidewalls of said mandrel strip, each of said stringer strips having a third feature width; and
   (d) removing the mandrel strip from between the stringer strips.

2. The method of claim 1, wherein said mask strip is formed using a photolithographic process, said photolithographic process operating at maximum resolution.

3. The method of claim 1, wherein the first feature width to second feature width ratio is 2:1, and the second feature width to third feature width ratio is 1:1.

4. The method of claim 1, wherein an expendable layer is formed on a substrate, the primary mask strip is applied superjacent the expendable layer, and the mandrel strip is formed by transferring the primary mask strip image to the expendable layer with a concomitant reduction of feature width.

5. The method of claim 4, wherein the primary mask strip is replicated in the expendable layer with an anisotropic etch, and the feature width reduction is accomplished by performing an isotropic etch of the expendable layer remnant.

6. The method of claim 5, wherein the isotropic etch which reduces feature width is performed with the primary mask strip in place.

7. The method of claim 6, wherein the feature width reduction is accomplished during the transfer of the primary mask strip image to the expendable layer with an anisotropic etch having an isotropic component.

8. The method of claim 1, wherein the primary mask strip has substantially vertical sidewalls and is formed from photoresist.

9. The method of claim 8, wherein the mandrel strip is formed directly from the primary mask strip by subjecting the primary mask strip to an isotropic etch.

10. The method of claim 9, wherein the stringers are formed from a material which is depositable at temperatures below that at which photoresist decomposes.

11. A method for manufacturing an integrated circuit, comprising the following sequence of steps:
    (a) forming a primary mask pattern, said mask pattern including a plurality of parallel mask strips, each mask strip having a first feature width, and each mask strip being separated from each adjacent strip by a first space width;
    (b) transforming the primary mask pattern into a pattern of parallel mandrel strips, each mandrel strip having substantially vertical sidewalls, a second feature width that is less than said first feature width, and being separated from each adjacent mandrel strip by a second space width that is less than said first space width;
    (c) forming stringer strips on the sidewalls of each mandrel strip, each of said stringer strips having a third feature width; and
    (d) removing the mandrel strips to leave a pattern of stringer strips, each stringer strip being separated from each adjacent stringer strip by a third space width.

12. The method of claim 1, wherein:
    the ratio of the first feature width to the first space width is substantially 1:1;
    the ratio of the second feature width to the second space width is substantially 1:3; and
    the ratio of the second feature width to the third feature width is 1:1.

13. The method of claim 12, wherein the primary mask pattern is formed using the maximum resolution of an employed photolithographic process.

14. The method of claim 12, wherein an expendable layer is formed on a substrate, and the primary pattern is applied superjacent the expendable layer.

15. The method of claim 14, wherein the pattern of mandrel strips is formed by replicating the primary mask pattern in the expendable layer with an anisotropic etch, and subsequently performing an isotropic etch of the expendable layer remnants to achieve a feature width reduction and corresponding space augmentation.

16. The method of claim 15, wherein the isotropic etch which reduces feature width and augments space width is performed with the primary mask pattern in place.

17. The method of claim 14, wherein the pattern of mandrel strips is formed by subjecting the expendable layer to an anisotropic etch having an isotropic component, which transfers the primary mask pattern to the expendable layer with a concurrent feature width reduction and corresponding space augmentation.

18. The method of claim 12, wherein the strips of the primary mask pattern have substantially vertical sidewalls and are formed from photoresist.

19. The method of claim 18, wherein the pattern of mandrel strips is formed directly from the primary mask pattern by subjecting the primary mask pattern to an isotropic etch.

20. The method of claim 19, wherein the stringer strips are formed from a material which can be deposited at temperatures below that at which photoresist decomposes.

21. The method of claim 20, wherein the stringer strips are formed from polymeric material.

22. The method of claim 12, wherein the pattern of mandrel strips is formed with the following sequence of steps:
    (a) replicating the primary pattern in the expendable layer to form a pattern of full-width expendable strips;
    (b) forming spacer strips on the sidewalls of each expendable strip;
    (c) depositing a layer of spin-on filler material;

(d) performing a planarization step which exposes the top of each expendable strip and each spacer strip; and (e) removing the expendable strips and spacer strips to leave a pattern of mandrel strips formed from filler material.

23. A method for halving the pitch of a primary mask, said method comprising the following sequence of steps:

(a) forming a primary mask pattern on an underlying layer, said primary mask pattern including a plurality of parallel photoresist strips of substantially identical feature width, said photoresist strips being equidistantly spaced from one another and having a feature width to space width ratio of substantially 1:1;

(b) forming a pattern of parallel, equidistantly-spaced mandrel strips on a substrate, said mandrel strips having substantially identical feature widths, substantially vertical sidewalls, a pitch that is identical to the pitch of the primary pattern, and a feature width to space width ratio of substantially 1:3;

(c) depositing a conformal, partially-expendable stringer layer on exposed regions of the substrate and on the top and sidewalls of each mandrel strip, said partially-expendable stringer layer having a thickness that is substantially equal to the width of each mandrel strip;

(d) anisotropically etching the partially-expendable stringer layer so as to form stringer strips on the sidewalls of each mandrel strip, and expose not only the top of each mandrel strip, but also regions of the substrate between each pair of stringer strip-widened mandrel strip; and (e) removing the mandrel strips to leave a pattern of stringer strips, said pattern of stringer strips having half the pitch of the primary mask pattern.

24. The method of claim 23, wherein the primary mask pattern is formed using the maximum resolution of an employed photolithographic process.

25. The method of claim 23, wherein the underlying layer is an expendable layer that is formed on the substrate.

26. The method of claim 25, wherein the pattern of mandrel strips is formed by replicating the primary mask pattern in the expendable layer with an anisotropic etch, and subsequently performing an isotropic etch of the expendable layer remnants to achieve a feature width reduction and corresponding space augmentation.

27. The method of claim 26, wherein the isotropic etch which reduces feature width and augments space width is performed with the primary mask pattern in place.

28. The method of claim 25, wherein the pattern of mandrel strips is formed by subjecting the expendable layer to an anisotropic etch having an isotropic component, which transfers the primary mask pattern to the expendable layer with a concurrent feature width reduction and corresponding space augmentation.

29. The method of claim 23, wherein the strips of the primary mask pattern have substantially vertical sidewalls and are formed from photoresist.

30. The method of claim 29, wherein the pattern of mandrel strips is formed directly from the primary mask pattern by subjecting the primary mask pattern to an isotropic etch.

31. The method of claim 30, wherein the stringer strips are formed from a material which can be deposited at temperatures below that at which photoresist decomposes.

32. The method of claim 31, wherein the stringer strips are formed from polymeric material.

* * * * *